(12) United States Patent
Platzgummer

(10) Patent No.: US 9,373,482 B2
(45) Date of Patent: Jun. 21, 2016

(54) CUSTOMIZING A PARTICLE-BEAM WRITER USING A CONVOLUTION KERNEL

(71) Applicant: IMS Nanofabrication AG, Vienna (AT)

(72) Inventor: Elmar Platzgummer, Vienna (AT)

(73) Assignee: IMS Nanofabrication AG, Vienna (AT)

( * ) Notice: Subject to any disclaimer, the term of this patent is extended or adjusted under 35 U.S.C. 154(b) by 0 days.

(21) Appl. No.: 14/795,547

(22) Filed: Jul. 9, 2015

(65) Prior Publication Data

US 2016/0012170 A1    Jan. 14, 2016

Related U.S. Application Data

(60) Provisional application No. 62/094,372, filed on Dec. 19, 2014.

(30) Foreign Application Priority Data

Jul. 10, 2014  (EP) ..................................... 14176563
Dec. 19, 2014 (EP) ..................................... 14199183

(51) Int. Cl.
*H01J 3/14* (2006.01)
*H01J 37/317* (2006.01)
(Continued)

(52) U.S. Cl.
CPC ......... *H01J 37/3177* (2013.01); *G06F 17/5072* (2013.01); *G06F 17/5081* (2013.01);
(Continued)

(58) Field of Classification Search
CPC ........... H01J 37/00; H01J 37/02; H01J 37/04; H01J 37/045; H01J 37/147; H01J 37/1471; H01J 37/1472; H01J 37/1474; H01J 37/1475; H01J 37/1477; H01J 37/156; H01J 37/22; H01J 37/222; H01J 37/224; H01J 37/226; H01J 37/228; H01J 37/244
USPC ........ 250/396 R, 492.1, 492.2, 492.22, 492.3
See application file for complete search history.

(56) References Cited

U.S. PATENT DOCUMENTS

| 1,033,741 A | 7/1912 | Sims |
| 1,420,104 A | 6/1922 | Howe et al. |

(Continued)

FOREIGN PATENT DOCUMENTS

| CN | 202204836 U | 4/2012 |
| EP | 1033741 A2 | 9/2000 |

(Continued)

OTHER PUBLICATIONS

European Search Report for Application 09450211.9-1226, report dated Sep. 14, 2010, 4 pgs.

(Continued)

*Primary Examiner* — Nicole Ippolito
*Assistant Examiner* — Jason McCormack
(74) *Attorney, Agent, or Firm* — KPPB LLP

(57) ABSTRACT

An exposure pattern is computed which is used for exposing a desired pattern on a target in a charged-particle multi-beam processing apparatus so as to match a reference writing tool, possible of different type: The desired pattern is provided as a graphical representation suitable for the reference tool, such as a raster graphics, on the image area on the target. A convolution kernel is used which describes a mapping from an element of the graphical representation to a group of pixels which is centered around a nominal position of said element. A nominal exposure pattern is calculated by convolution of the graphical representation with the convolution kernel, said nominal exposure pattern being suitable to create a nominal dose distribution on the target when exposed with the processing apparatus.

16 Claims, 19 Drawing Sheets

(51) Int. Cl.
*H01J 37/302* (2006.01)
*G06F 17/50* (2006.01)
*H01J 37/09* (2006.01)
*H01J 37/04* (2006.01)

(52) U.S. Cl.
CPC .............. *H01J37/045* (2013.01); *H01J 37/09* (2013.01); *H01J 37/3026* (2013.01); *H01J 37/3175* (2013.01); *H01J 2237/043* (2013.01); *H01J 2237/31725* (2013.01); *H01J 2237/31764* (2013.01)

(56) References Cited

U.S. PATENT DOCUMENTS

| | | | |
|---|---|---|---|
| 1,903,005 A | 3/1933 | Mccuen | |
| 2,187,427 A | 1/1940 | Middleton | |
| 2,820,109 A | 1/1958 | Dewitz | |
| 2,920,104 A | 1/1960 | Brooks et al. | |
| 3,949,265 A | 4/1976 | Holl | |
| 4,467,211 A | 8/1984 | Smith et al. | |
| 4,735,881 A | 4/1988 | Kobayashi et al. | |
| 5,103,101 A | 4/1992 | Berglund et al. | |
| 5,260,579 A | 11/1993 | Yasuda et al. | |
| 5,369,282 A | 11/1994 | Arai et al. | |
| 5,399,872 A | 3/1995 | Yasuda et al. | |
| 5,814,423 A | 9/1998 | Maruyama et al. | |
| 5,841,145 A | 11/1998 | Satoh et al. | |
| 5,847,959 A * | 12/1998 | Veneklasen | B82Y 10/00 250/492.2 |
| 5,857,815 A | 1/1999 | Bailey et al. | |
| 5,876,902 A | 3/1999 | Veneklasen | |
| 5,933,211 A | 8/1999 | Nakasugi et al. | |
| 6,014,200 A | 1/2000 | Sogard et al. | |
| 6,043,496 A | 3/2000 | Tennant | |
| 6,049,085 A | 4/2000 | Ema | |
| 6,111,932 A | 8/2000 | Dinsmore | |
| 6,137,113 A | 10/2000 | Muraki | |
| 6,225,637 B1 | 5/2001 | Terashima et al. | |
| 6,229,595 B1 | 5/2001 | McKinley et al. | |
| 6,252,339 B1 | 6/2001 | Kendall | |
| 6,280,798 B1 | 8/2001 | Ring et al. | |
| 6,333,138 B1 | 12/2001 | Higashikawa et al. | |
| 6,472,673 B1 | 10/2002 | Chalupka et al. | |
| 6,473,237 B2 | 10/2002 | Mei | |
| 6,552,353 B1 | 4/2003 | Muraki | |
| 6,617,587 B2 | 9/2003 | Parker | |
| 6,767,125 B2 | 7/2004 | Midas et al. | |
| 6,768,123 B2 | 7/2004 | Giering | |
| 6,768,125 B2 | 7/2004 | Platzgummer et al. | |
| 6,786,125 B2 | 9/2004 | Imai | |
| 6,835,937 B1 | 12/2004 | Muraki et al. | |
| 6,858,118 B2 | 2/2005 | Platzgummer et al. | |
| 6,965,153 B1 | 11/2005 | Ono et al. | |
| 7,084,411 B2 | 8/2006 | Lammer-Pachlinger et al. | |
| 7,124,660 B2 | 10/2006 | Chiang | |
| 7,129,024 B2 | 10/2006 | Ki | |
| 7,199,373 B2 | 4/2007 | Stengl et al. | |
| 7,201,213 B2 | 4/2007 | Leeson et al. | |
| 7,214,951 B2 | 5/2007 | Stengl et al. | |
| 7,276,714 B2 | 10/2007 | Platzgummer et al. | |
| 7,459,247 B2 | 12/2008 | Bijnen et al. | |
| 7,687,783 B2 | 3/2010 | Platzgummer et al. | |
| 7,710,634 B2 | 5/2010 | Sandstrom | |
| 7,714,298 B2 | 5/2010 | Platzgummer et al. | |
| 7,772,574 B2 | 8/2010 | Stengl et al. | |
| 7,777,201 B2 | 8/2010 | Fragner et al. | |
| 7,781,748 B2 | 8/2010 | Platzgummer et al. | |
| 7,823,081 B2 | 10/2010 | Sato et al. | |
| 8,057,972 B2 | 11/2011 | Fragner et al. | |
| 8,183,543 B2 | 5/2012 | Platzgummer et al. | |
| 8,198,601 B2 | 6/2012 | Platzgummer et al. | |
| 8,222,621 B2 | 7/2012 | Fragner et al. | |
| 8,227,768 B2 | 7/2012 | Smick et al. | |
| 8,257,888 B2 | 9/2012 | Sczyrba et al. | |
| 8,258,488 B2 | 9/2012 | Platzgummer et al. | |
| 8,294,117 B2 | 10/2012 | Kruit et al. | |
| 8,304,749 B2 | 11/2012 | Platzgummer et al. | |
| 8,378,320 B2 | 2/2013 | Platzgummer | |
| 8,502,174 B2 | 8/2013 | Wieland | |
| 8,546,767 B2 | 10/2013 | Platzgummer et al. | |
| 8,563,942 B2 | 10/2013 | Platzgummer | |
| 8,598,544 B2 | 12/2013 | Van de Peut et al. | |
| 9,053,906 B2 | 6/2015 | Platzgummer | |
| 9,093,201 B2 | 7/2015 | Platzgummer et al. | |
| 9,099,277 B2 | 8/2015 | Platzgummer | |
| 9,269,543 B2 | 2/2016 | Reiter et al. | |
| 2001/0028038 A1 | 10/2001 | Hamaguchi et al. | |
| 2002/0021426 A1 | 2/2002 | Mei et al. | |
| 2002/0148978 A1 | 10/2002 | Innes et al. | |
| 2003/0085360 A1 | 5/2003 | Parker et al. | |
| 2003/0106230 A1 | 6/2003 | Hennessey | |
| 2003/0155534 A1 | 8/2003 | Platzgummer et al. | |
| 2003/0160980 A1* | 8/2003 | Olsson | G03F 1/14 358/1.9 |
| 2004/0058536 A1 | 3/2004 | Ki | |
| 2004/0119021 A1 | 6/2004 | Parker et al. | |
| 2004/0157407 A1 | 8/2004 | Tong et al. | |
| 2004/0169147 A1 | 9/2004 | Ono et al. | |
| 2005/0063510 A1 | 3/2005 | Hieronimi et al. | |
| 2005/0104013 A1 | 5/2005 | Stengl et al. | |
| 2005/0242302 A1 | 11/2005 | Platzgummer et al. | |
| 2005/0242303 A1 | 11/2005 | Platzgummer | |
| 2006/0060775 A1 | 3/2006 | Sakakibara et al. | |
| 2006/0076509 A1 | 4/2006 | Okino et al. | |
| 2006/0169925 A1 | 8/2006 | Miyajima et al. | |
| 2007/0138374 A1 | 6/2007 | Nishibashi et al. | |
| 2007/0178407 A1 | 8/2007 | Hatakeyama et al. | |
| 2007/0279768 A1 | 12/2007 | Shibazaki et al. | |
| 2008/0024745 A1 | 1/2008 | Baselmans et al. | |
| 2008/0080782 A1 | 4/2008 | Olsson et al. | |
| 2008/0099693 A1 | 5/2008 | Platzgummer et al. | |
| 2008/0105827 A1 | 5/2008 | Tamamushi | |
| 2008/0128638 A1 | 6/2008 | Doering et al. | |
| 2008/0142728 A1 | 6/2008 | Smick et al. | |
| 2008/0198352 A1 | 8/2008 | Kugler et al. | |
| 2008/0203317 A1 | 8/2008 | Platzgummer et al. | |
| 2008/0237460 A1 | 10/2008 | Fragner et al. | |
| 2008/0257096 A1 | 10/2008 | Zhu et al. | |
| 2008/0283767 A1 | 11/2008 | Platzgummer | |
| 2008/0299490 A1 | 12/2008 | Takekoshi | |
| 2009/0032700 A1 | 2/2009 | Park et al. | |
| 2009/0101816 A1 | 4/2009 | Noji et al. | |
| 2009/0256075 A1 | 10/2009 | Kemen et al. | |
| 2009/0321631 A1 | 12/2009 | Smick et al. | |
| 2010/0127185 A1* | 5/2010 | Fragner | B82Y 10/00 250/398 |
| 2010/0178602 A1 | 7/2010 | Seto et al. | |
| 2010/0187434 A1 | 7/2010 | Platzgummer et al. | |
| 2010/0288938 A1 | 11/2010 | Platzgummer | |
| 2011/0053087 A1 | 3/2011 | Nielsen et al. | |
| 2011/0073782 A1 | 3/2011 | Wieland | |
| 2011/0204253 A1 | 8/2011 | Platzgummer et al. | |
| 2011/0226968 A1 | 9/2011 | Platzgummer | |
| 2012/0076269 A1 | 3/2012 | Roberts et al. | |
| 2012/0085940 A1 | 4/2012 | Matsumoto | |
| 2012/0211674 A1 | 8/2012 | Kato | |
| 2012/0286169 A1 | 11/2012 | Van de Peut et al. | |
| 2012/0286170 A1 | 11/2012 | Van De Peut et al. | |
| 2013/0164684 A1 | 6/2013 | Yamanaka | |
| 2013/0252145 A1 | 9/2013 | Matsumoto et al. | |
| 2013/0253688 A1 | 9/2013 | Matsumoto et al. | |
| 2014/0197327 A1 | 7/2014 | Platzgummer | |
| 2014/0240732 A1* | 8/2014 | Tinnemans | G03F 7/70291 358/1.9 |
| 2015/0021493 A1 | 1/2015 | Platzgummer | |
| 2015/0028230 A1 | 1/2015 | Platzgummer | |
| 2015/0069260 A1 | 3/2015 | Platzgummer | |
| 2015/0248993 A1 | 9/2015 | Reiter et al. | |
| 2015/0311030 A1 | 10/2015 | Platzgummer et al. | |
| 2015/0311031 A1 | 10/2015 | Platzgummer et al. | |

(56) References Cited

U.S. PATENT DOCUMENTS

2016/0013019 A1 1/2016 Platzgummer
2016/0071684 A1 3/2016 Platzgummer et al.

FOREIGN PATENT DOCUMENTS

| EP | 2019415 | A1 | 1/2009 |
|----|---------|----|--------|
| EP | 2187427 | A2 | 5/2010 |
| EP | 2214194 | A1 | 8/2010 |
| EP | 2317535 | A2 | 5/2011 |
| EP | 2363875 | A1 | 9/2011 |
| GB | 2349737 | A | 11/2000 |
| JP | 08213301 | A | 8/1996 |
| JP | 2006019436 | A | 1/2006 |
| JP | 2006332289 | | 12/2006 |
| WO | 2006084298 | A1 | 8/2006 |
| WO | 2008053140 | A1 | 5/2008 |
| WO | 2009147202 | | 12/2009 |
| WO | 2012172913 | A1 | 12/2012 |

OTHER PUBLICATIONS

European Search Report for application 09450212.7, report dated Sep. 28, 2010, 9 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851, report dated Oct. 16, 2014; 1 page.
European Search Report for Application 14199183, report dated Jun. 19, 2015, 2 pgs.
European Search Report for Application 15164770, report dated Sep. 18, 2015; 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, report dated Dec. 1, 2014, 1 pg.
European Search Report for Application 08450077.6, report dated Jan. 29, 2010.
European Search Report for Application 141501197.7, report dated Jun. 6, 2014, 2 pgs.
European Search Report for Application 10450070.7, report dated May 7, 2012, 2 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al.,"Characterization of CMOS programmable multi-beam blanking arrays as used for programmable multi-beam projection lithography and reisitless nanopatterning", Journal of Micromechanics and Microengineering, 21 (2001), pp. 1-8.
Li, H. Y. et al.,"Through-Silicon Interposer Technology for Heterogeneous Integration", Future Fab Intl., Issue 45 (Apr. 25, 2013).
Paraskevopoulos, A. et al., "Scalable (24-140 Gbps) optical data link, well adapted for future maskless lithography applications", Proc. SPIE vol. 7271, 72711 I (2009).
Platzgummer, Elmar et al., "eMET POC: Realization of a proof-of-concept 50 keV electron multibeam Mask Exposure Tool", Proc. of SPIE vol. 8166, 816622-1, 2011.
Platzgummer et al., "eMET—50keV electron Mask Exposure Tool Development based on proven multi-beam projection technology", Proc. of SPIE, vol. 7823, pp. 782308-1-782308-12.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

\* cited by examiner

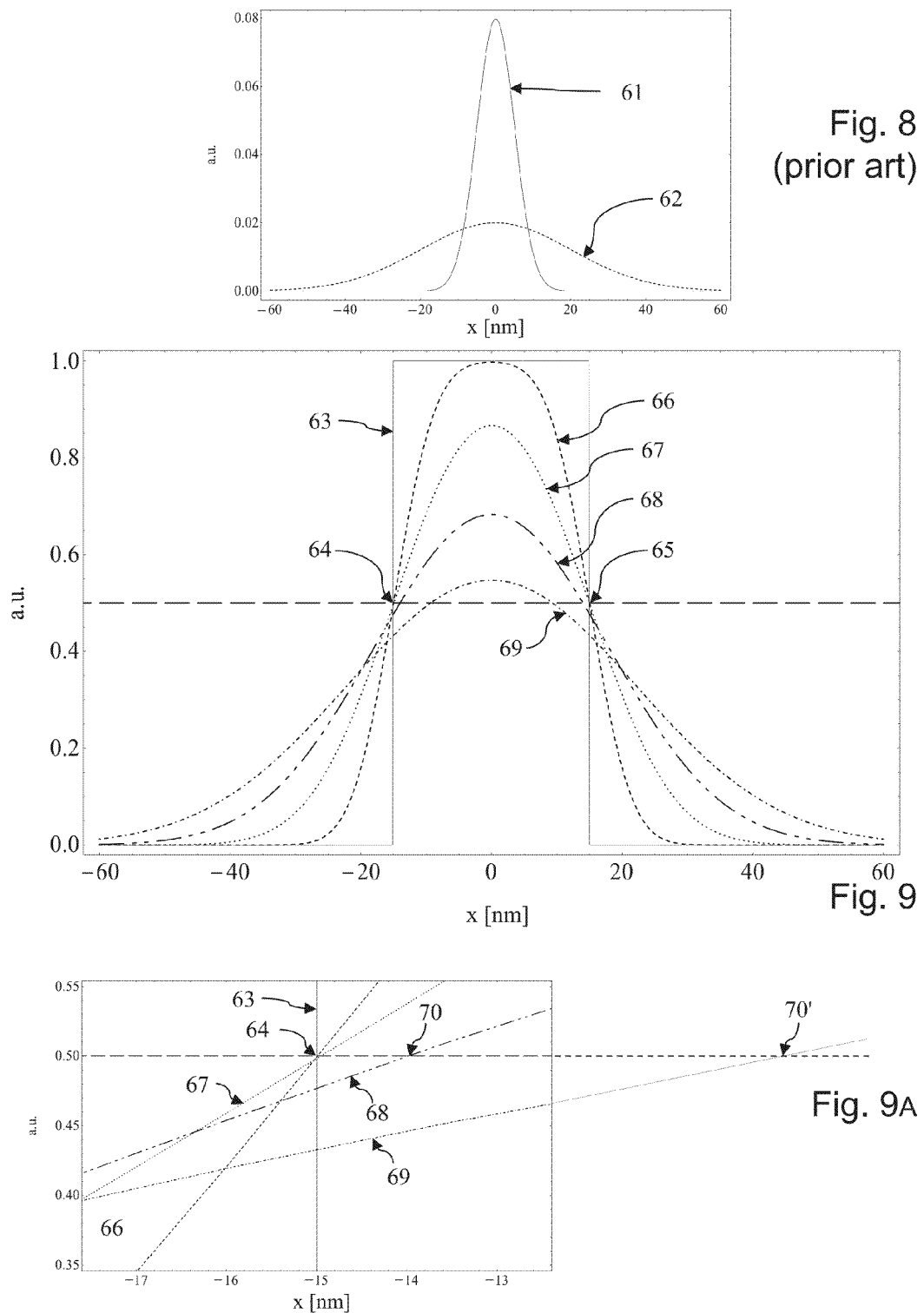

| 0 | 0 | 0 | 0 | 0 | 0 | 0 | 0 | 5 | 5 | 5 | 5 | 5 | 5 | 0 | 0 | 0 | 0 | 0 | 0 | 0 |
|---|---|---|---|---|---|---|---|---|---|---|---|---|---|---|---|---|---|---|---|---|
| 0 | 0 | 0 | 0 | 0 | 5 | 5 | 5 | 9 | 9 | 9 | 9 | 9 | 9 | 5 | 5 | 5 | 0 | 0 | 0 | 0 |
| 0 | 0 | 0 | 0 | 5 | 5 | 9 | 9 | 14 | 14 | 14 | 14 | 14 | 14 | 9 | 9 | 5 | 5 | 0 | 0 | 0 |
| 0 | 0 | 0 | 5 | 9 | 9 | 14 | 14 | 24 | 24 | 24 | 24 | 24 | 14 | 14 | 9 | 9 | 5 | 0 | 0 | 0 |
| 0 | 0 | 5 | 9 | 9 | 14 | 24 | 24 | 61 | 61 | 61 | 61 | 61 | 24 | 24 | 14 | 9 | 9 | 5 | 0 | 0 |
| 0 | 5 | 5 | 9 | 14 | 24 | 24 | 61 | 61 | 80 | 80 | 80 | 80 | 61 | 61 | 24 | 24 | 14 | 9 | 5 | 5 | 0 |
| 0 | 5 | 9 | 14 | 24 | 24 | 61 | 80 | 80 | 108 | 108 | 108 | 108 | 80 | 80 | 61 | 24 | 24 | 14 | 9 | 5 | 0 |
| 0 | 5 | 9 | 14 | 24 | 61 | 80 | 108 | 108 | 146 | 146 | 146 | 146 | 108 | 108 | 80 | 61 | 24 | 14 | 9 | 5 | 0 |
| 5 | 9 | 14 | 24 | 61 | 61 | 80 | 108 | 146 | 165 | 165 | 165 | 165 | 146 | 108 | 80 | 61 | 61 | 24 | 14 | 9 | 5 |
| 5 | 9 | 14 | 24 | 61 | 80 | 108 | 146 | 165 | 165 | 212 | 212 | 165 | 165 | 146 | 108 | 80 | 61 | 24 | 14 | 9 | 5 |
| 5 | 9 | 14 | 24 | 61 | 80 | 108 | 146 | 165 | 212 | 240 | 240 | 212 | 165 | 146 | 108 | 80 | 61 | 24 | 14 | 9 | 5 |
| 5 | 9 | 14 | 24 | 61 | 80 | 108 | 146 | 165 | 212 | 240 | 240 | 212 | 165 | 146 | 108 | 80 | 61 | 24 | 14 | 9 | 5 |
| 5 | 9 | 14 | 24 | 61 | 80 | 108 | 146 | 165 | 165 | 212 | 212 | 165 | 165 | 146 | 108 | 80 | 61 | 24 | 14 | 9 | 5 |
| 5 | 9 | 14 | 24 | 61 | 61 | 80 | 108 | 146 | 165 | 165 | 165 | 165 | 146 | 108 | 80 | 61 | 61 | 24 | 14 | 9 | 5 |
| 0 | 5 | 9 | 14 | 24 | 61 | 80 | 108 | 108 | 146 | 146 | 146 | 146 | 108 | 108 | 80 | 61 | 24 | 14 | 9 | 5 | 0 |
| 0 | 5 | 9 | 14 | 24 | 24 | 61 | 80 | 80 | 108 | 108 | 108 | 108 | 80 | 80 | 61 | 24 | 24 | 14 | 9 | 5 | 0 |
| 0 | 5 | 5 | 9 | 14 | 24 | 24 | 61 | 61 | 80 | 80 | 80 | 80 | 61 | 61 | 24 | 24 | 14 | 9 | 5 | 5 | 0 |
| 0 | 0 | 5 | 9 | 9 | 14 | 24 | 24 | 61 | 61 | 61 | 61 | 61 | 24 | 24 | 14 | 9 | 9 | 5 | 0 | 0 |
| 0 | 0 | 0 | 5 | 9 | 9 | 14 | 14 | 24 | 24 | 24 | 24 | 24 | 14 | 14 | 9 | 9 | 5 | 0 | 0 | 0 |
| 0 | 0 | 0 | 0 | 5 | 5 | 9 | 9 | 14 | 14 | 14 | 14 | 14 | 9 | 9 | 5 | 5 | 0 | 0 | 0 | 0 |
| 0 | 0 | 0 | 0 | 0 | 5 | 5 | 5 | 9 | 9 | 9 | 9 | 9 | 5 | 5 | 5 | 0 | 0 | 0 | 0 | 0 |
| 0 | 0 | 0 | 0 | 0 | 0 | 0 | 0 | 5 | 5 | 5 | 5 | 5 | 0 | 0 | 0 | 0 | 0 | 0 | 0 | 0 |

| 0 | 0 | 0 | 0 | 0 | 0 | 0 | 0 | 0 | 0 | 0 | 0 | 0 | 0 | 0 | 0 | 0 | 0 | 0 |
|---|---|---|---|---|---|---|---|---|---|---|---|---|---|---|---|---|---|---|
| 0 | 0 | 0.1 | 0.1 | 0.1 | 0.1 | 0.2 | 0.2 | 0.2 | 0.2 | 0.2 | 0.2 | 0.2 | 0.1 | 0.1 | 0.1 | 0.1 | 0 | 0 |
| 0.1 | 0.2 | 0.3 | 0.4 | 0.5 | 0.7 | 0.8 | 0.9 | 1.0 | 1.0 | 1.0 | 0.9 | 0.8 | 0.7 | 0.5 | 0.4 | 0.3 | 0.2 | 0.1 |
| 0.5 | 0.7 | 1.1 | 1.6 | 2.2 | 2.8 | 3.4 | 3.9 | 4.3 | 4.4 | 4.3 | 3.9 | 3.4 | 2.8 | 2.2 | 1.6 | 1.1 | 0.7 | 0.5 |
| 1.6 | 2.5 | 3.8 | 5.5 | 7.5 | 9.6 | 11.6 | 13.4 | 14.5 | 14.9 | 14.5 | 13.4 | 11.6 | 9.6 | 7.5 | 5.5 | 3.8 | 2.5 | 1.6 |
| 4.3 | 6.9 | 10.4 | 14.9 | 20.3 | 26.0 | 31.6 | 36.3 | 39.5 | 40.6 | 39.5 | 36.3 | 31.6 | 26.0 | 20.3 | 14.9 | 10.4 | 6.9 | 4.3 |
| 9.3 | 14.9 | 22.6 | 32.5 | 44.1 | 56.6 | 68.8 | 79.0 | 85.9 | 88.3 | 85.9 | 79.0 | 68.8 | 56.6 | 44.1 | 32.5 | 22.6 | 14.9 | 9.3 |
| 16.2 | 26.0 | 39.5 | 56.6 | 76.8 | 98.7 | 119.8 | 137.7 | 149.7 | 153.9 | 149.7 | 137.7 | 119.8 | 98.7 | 76.8 | 56.6 | 39.5 | 26.0 | 16.2 |
| 22.6 | 36.3 | 55.1 | 79.0 | 107.2 | 137.7 | 167.3 | 192.2 | 208.9 | 214.8 | 208.9 | 192.2 | 167.3 | 137.7 | 107.2 | 79.0 | 55.1 | 36.3 | 22.6 |
| 25.3 | 40.6 | 61.5 | 88.3 | 119.8 | 153.9 | 186.9 | 214.8 | 233.4 | 240.0 | 233.4 | 214.8 | 186.9 | 153.9 | 119.8 | 88.3 | 61.5 | 40.6 | 25.3 |
| 22.6 | 36.3 | 55.1 | 79.0 | 107.2 | 137.7 | 167.3 | 192.2 | 208.9 | 214.8 | 208.9 | 192.2 | 167.3 | 137.7 | 107.2 | 79.0 | 55.1 | 36.3 | 22.6 |
| 16.2 | 26.0 | 39.5 | 56.6 | 76.8 | 98.7 | 119.8 | 137.7 | 149.7 | 153.9 | 149.7 | 137.7 | 119.8 | 98.7 | 76.8 | 56.6 | 39.5 | 26.0 | 16.2 |
| 9.3 | 14.9 | 22.6 | 32.5 | 44.1 | 56.6 | 68.8 | 79.0 | 85.9 | 88.3 | 85.9 | 79.0 | 68.8 | 56.6 | 44.1 | 32.5 | 22.6 | 14.9 | 9.3 |
| 4.3 | 6.9 | 10.4 | 14.9 | 20.3 | 26.0 | 31.6 | 36.3 | 39.5 | 40.6 | 39.5 | 36.3 | 31.6 | 26.0 | 20.3 | 14.9 | 10.4 | 6.9 | 4.3 |
| 1.6 | 2.5 | 3.8 | 5.5 | 7.5 | 9.6 | 11.6 | 13.4 | 14.5 | 14.9 | 14.5 | 13.4 | 11.6 | 9.6 | 7.5 | 5.5 | 3.8 | 2.5 | 1.6 |
| 0.5 | 0.7 | 1.1 | 1.6 | 2.2 | 2.8 | 3.4 | 3.9 | 4.3 | 4.4 | 4.3 | 3.9 | 3.4 | 2.8 | 2.2 | 1.6 | 1.1 | 0.7 | 0.5 |
| 0.1 | 0.2 | 0.3 | 0.4 | 0.5 | 0.7 | 0.8 | 0.9 | 1.0 | 1.0 | 1.0 | 0.9 | 0.8 | 0.7 | 0.5 | 0.4 | 0.3 | 0.2 | 0.1 |
| 0 | 0 | 0.1 | 0.1 | 0.1 | 0.1 | 0.2 | 0.2 | 0.2 | 0.2 | 0.2 | 0.2 | 0.2 | 0.1 | 0.1 | 0.1 | 0.1 | 0 | 0 |
| 0 | 0 | 0 | 0 | 0 | 0 | 0 | 0 | 0 | 0 | 0 | 0 | 0 | 0 | 0 | 0 | 0 | 0 | 0 |

Fig. 24c

CUSTOMIZING A PARTICLE-BEAM WRITER USING A CONVOLUTION KERNEL

CROSS REFERENCE TO RELATED APPLICATIONS

This application claims priority to U.S. Provisional Application No. 62/094,372 filed on Dec. 19, 2014, European Application No. 14199183.6 filed on Dec. 19, 2014, and European Application No. 14176563.6 filed on Jul. 10, 2014, the disclosures of which are hereby incorporated by reference in their entireties.

FIELD OF THE INVENTION AND DESCRIPTION OF PRIOR ART

Embodiments of the invention relates to a charged-particle multi-beam processing apparatus for forming a pattern on a surface of a substrate or target by means of a beam of energetic electrically charged particles and to calculating patterns to be generated on a target with such processing apparatus. More in detail, in many embodiments, the invention relates to a method for computing an exposure pattern for exposing a desired pattern on a target in a charged-particle multi-beam processing apparatus, in which a particle beam is directed to and illuminates a pattern definition device comprising an aperture array composed of a plurality of blanking apertures through which said particle beam penetrates for writing said desired pattern by exposing a multitude of pixels within an image area on the target, wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale, wherein during a writing process of said desired pattern, a sequence of exposure intervals is made, wherein in each exposure interval the blanking apertures are imaged onto the target, thus generating a corresponding plurality of aperture images. Furthermore, in many embodiments, the invention relates to a charged-particle multi-beam processing apparatus for exposure of a target by means of a structured beam of electrically charged particles, configured to employ a method of the mentioned kind.

As a typical implementation of an MBW, the applicant has realized a 50 keV electron writer tool implementing a total beam size of 20 nm comprising 512×512 (=262,144) programmable beamlets within a beam array field of dimensions 81.92 µm×81.92 µm at the substrate. In this system, which is referred to as "MBMW tool" hereinafter, the substrate is, typically, a 6" mask blank (having an area of 6"×6"=152.4 mm×152.4 mm and thickness 6"/4=6.35 mm) covered with an electron beam sensitive resist; furthermore, multi-beam writing is possible on resist-covered 150 mm Si wafers as well.

The current density of a typical MBW, such as the MBMW tool, is no higher than 1 A/cm$^2$ when using 20 nm beam size. Thus, when all programmable 262,144 beamlets are "on" the maximum current is 1.05 µA. In this implementation the 1 sigma blur of the MBW column is approx. 5 nm, as verified experimentally.

There is the possibility to change the beam size, e.g., from 20 nm to 10 nm. For a column with 200:1 reduction this is straightforward by using a different aperture array plate (AAP), with 2 µm×2 µm opening size of the apertures instead of 4 µm×4 µm opening size. As outlined in U.S. Pat. No. 8,546,767 of the applicant, an change of the beam size may also be realized in-situ by spatial adjustment of the AAP having multiple aperture arrays of different geometric parameters, such a total size, aperture spacing, aperture shapes etc.

When using a 10 nm beam size and providing a current density at the substrate of no higher than 4 A/cm$^2$, the current of 262,144 programmable beamlets (with all beamlets "on") is again 1.05 µA at maximum. Thus, also in this case there is virtually no change of the 1 sigma blur of the column with current through the column.

The first generation MBW production machines are targeted to use 20 nm and 10 nm beams providing up to approx. 1 µA current for all 262,144 programmable beams "on". For following generations of MBW production machines there is the plan to use even smaller beam size, for instance of 8 nm, and concurrently to provide e.g. 640×640=409,600 beamlets within the 81.92 µm×81.92 µm beam array field at the substrate. Keeping the maximum current density at 4 A/cm$^2$ will ensure that the maximum current (with all beamlets "on") is 1.05 µA. For instance, using a 5 nm beam size allows providing e.g. 1024×1024=1,048,576 programmable beams within the mentioned beam array field at the substrate; again, at a maximum current density of 4 A/cm$^2$ the maximum current (with all beamlets "on") is 1.05 µA.

In contrast to the MBW setup of the kind described above, the typical current density of variable shaped beam (VSB) mask writers is higher by two orders of magnitude. The current density is as high as 400 A/cm$^2$ as specified for a typical VSB mask writer such as the EBM-8000 VSB mask writer tool. In the VSB mask writer the shape size is varied dynamically during writing. This causes a considerable variation of the amount of current through the column depending on shot size. With a current density of 400 A/cm$^2$ the current for a 10 nm×10 nm shot is 0.4 nA. For the EBM-8000 VSB mask writer tool the largest shape size is 0.35 µm square. With a current density of 400 A/cm$^2$ for this shot size the current would be as high as approx. 0.5 µA, which is a variation of current by three orders of magnitude. This implies that the point spread function (PSF) and, consequently, the blur of the VSB column is not constant, but varies with the current through the VSB column.

In FIG. 8 two examples of a PSF profile are given. PSF profile 61 is for a 1sigma blur of 5 nm, whereas PSF profile 62 is for a 1sigma blur of 20 nm; it is evident that 62 is degraded due to the increased current through the VSB column. If blur is neglected ("zero blur"), the intensity profile 63 is shown for a line with 30 nm line width in FIG. 9. The "0.5" level of the intensity profile corresponds to the "dose to clear" leading to resist development. Since the "0.5" level defines the edge of the line to be written, the effect of the blur may cause different dose latitudes and thus deviations of the edge position as written from the nominal desired positions. The desired positions 64 and 65 of the left edge and right edge, respectively, are fulfilled for the zero-blur intensity profile 63. For a 5 nm 1sigma blur the intensity profile 66 can still fulfill this condition to a large extent; but the intensity profiles 67, 68, and 69 for 10 nm, 15 nm, and 20 nm 1sigma blur, respectively are increasingly deviating. In particular, as can be seen from FIG. 9 and the enlarged detail of FIG. 9A, the positions of the intensity-profile (i.e., "0.5"-level intersections) are shifted away from desired edge positions 64 and 65 (left-hand and right-hand edge respectively) to degraded edge positions 70 and 70', respectively with the intensity profiles for a 1sigma blur of 15 nm and 20 nm. This illustrates that for the VSB writer the exposed line width will depend on the blur, which is a function of the current through the column. In order to meet the stringent target conditions of critical dimension (CD), the VSB tool needs to induce proper dose and/or size corrections during writing.

The multi-beam writer setup, such as the MBMW tool of the applicant as described above, has significant and important advantages compared to the VSB writer tool or to other reference tools as e.g. multiple laser beam writers.

When using a MBW-type device in a commercial or captive mask shop which employs multiple laser beam writers and/or reference tools such as VSB mask writers in parallel, there is the desire of the user to use the MBW also for the realization of masks which are planned to be written with a reference tool, with the aim to realize a shorter mask write time and/or to achieve improved mask pattern quality. A third aim is to realize masks with the MBW which have the same quality compared to reference writer tool in order to provide a tool-to-tool comparison.

Therefore, an object of many embodiments of the invention is to provide a way of supplying a data set which has been prepared for the reference tool, e.g. a VSB mask writer tool, to a MBW-type device and to adapt a MBW-type device so as to enable it to perform the desired task.

In a special case, the reference tool may also be a tool of the MBW type itself, when there is the task to alter specific performance features, for example to change the line width in a specific direction, or to change the area of small square patterns or to change the width of specific lines.

SUMMARY OF THE INVENTION

According to a first aspect of a number of embodiments of the invention, a method is proposed for computing an exposure pattern for exposing a desired pattern on a target in a charged-particle multi-beam processing apparatus, wherein starting from a method as described in the beginning of this disclosure the method comprises the following steps:
i) providing the desired pattern as a graphical representation on the image area on the target, said graphical representation having a predetermined width of resolution, where the width of resolution is usually larger than a nominal distance between neighboring positions of the pixels within said image area,
ii) providing a convolution kernel, said kernel describing a mapping from an element of the graphical representation to a group of pixels, said group of pixels being centered around a nominal position of said element,
iii) calculating a nominal exposure pattern as a pixel raster graphics defined on the multitude of pixels, by convolution of the graphical representation with the convolution kernel, said nominal exposure pattern being suitable to create a nominal dose distribution on the target; the nominal dose distribution may emulate a desired intensity distribution or may serve to realize contour lines of the desired pattern.

The nominal exposure pattern thus generated may suitably include for each pixel a respective nominal dose value $P^\circ$. It is remarked that steps i and ii may be performed in any relative temporal order.

This solution according to the present invention presents an approach for adapting a multi-beam writer device of known type with respect to its data path, enabling to use a reference tool data file as data input while employing a multi-beam writer device, such as one of the eMET/MBMW/PML2 apparatuses described above, to realize the pattern in the desired quality of CD (critical dimension), CDU (CD uniformity), pattern fidelity while also meeting the registration (placement) specifications. Further, many embodiments of the invention realize processing of a substrate (such as a 6" mask or Silicon wafer) with the multi-beam writer device within reduced time compared to the processing time needed with the reference tool, e.g. VSB mask writer.

Several embodiments of the invention can also be used to improve the result of the multi-beam writer device by using metrology feedback, for example, to calibrate out a different line width and/or scale in X and Y directions of patterns patterned with the multi-beam writer device. Similarly, the kernel many embodiments of the invention can be used to enhance specific pattern types, e.g. contact holes (typically square or round patterns) by using a specific convolution kernel that relates to the size of the to-be-modified feature.

Another aspect of a number of embodiments of the invention relate to a charged-particle multi-beam processing apparatus for exposure of a target by means of a structured beam of electrically charged particles, comprising an illumination system, a pattern definition device and a projection optics system, where the illumination system is configured to produce a beam of said electrically charged particles and form it into a wide beam illuminating the pattern definition device; the pattern definition device being configured to form the shape of the illuminating beam into a structured beam composed of a multitude of sub-beams, and the projection optics system being configured to project an image of the beam shape defined in the pattern definition device onto the target, thus exposing a multitude of pixels within an image area on the target, wherein the pattern definition device comprises an aperture array composed of a plurality of blanking apertures forming said sub-beams, said plurality of blanking apertures being arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale, wherein during a writing process of said desired pattern, a sequence of exposure intervals is made, wherein in each exposure interval the blanking apertures are imaged onto the target, thus generating a corresponding plurality of aperture images; the processing apparatus is, according to several embodiments of the invention, configured for emulating a writing process for a desired pattern in a reference writing apparatus, said reference writing apparatus having a point spreading function having a width of resolution larger than a nominal width of the aperture images generated by the processing apparatus, using the method of a number of embodiments of the invention to convert the desired pattern into a nominal exposure pattern which can be written with the processing apparatus.

In a suitable development of several embodiments of the invention which allows a finer control of the placement of pattern features to be produced, the writing process generates aperture images which are mutually overlapping, and the aperture images have a nominal width which is a multiple of the distance (by a factor o greater than one, in a typical case an integer factor) between pixel positions of neighboring aperture images generated on the target, the method having the additional step of:
iv) generating, from the nominal exposure pattern, an exposure pattern suitable to expose the desired pattern by said writing process through exposure of aperture images.

In a typical application of the method of a number of embodiments of the invention, the graphical representation in step i is a raster graphics on a reference raster having a raster width, said raster width being used as width of resolution. Alternatively, the graphical representation may be a vector graphics which is then converted to a raster graphics on a reference raster having a raster width which is preferably larger than a nominal distance between neighboring positions of the pixels within said image area.

According to a suitable aspect of several embodiments of the invention, the calculations of step iii, and (where present) subsequent calculations, are performed during a writing process in real time, performing associated calculations transiently without permanent storing of the data calculated.

In one advantageous realization the convolution kernel may represent a point spreading function of a reference writing apparatus to be emulated by means of said processing apparatus. Typically, the point spreading function of the processing apparatus itself can often be neglected in this context since it is much smaller than that of the reference writing apparatus.

One suitable representation of the convolution kernel is in the form of a discrete matrix of pixel values. Thus, the convolution in step iii may be performed as discrete convolution, i.e., over the discrete elements of the matrix.

Another aspect of certain embodiments of the invention realizes a convolution kernel which is anisotropic with regard to two main directions on the image area. This enables suitable handling of elliptical point spread function or other anisotropies, in order to emulate and/or compensate such anisotropic behavior of a reference tool. As one advantageous application, the anisotropy of the kernel may be used for compensating an anisotropy of imaging the blanking apertures onto the target, with respect to the multi-beam writer and/or the reference tool to be emulated.

Furthermore, the convolution kernel may also include time-dependent values, namely, a time dependency corresponding to a time-dependent writing behavior of a reference writing apparatus to be emulated. For instance, the time-dependent values may comprise a time dependency corresponding to an ageing function of the sensitivity of the target, such as a charged-particle beam sensitive resist layer present on the target. As a further example, alternatively or in combination, where the particle beam is generated from a source generating a particle current which may vary in time, the time-dependency may comprise a function corresponding to a fluctuation function of the total current emitted from the source.

Another advantageous development of many embodiments of the invention employs two or more convolution kernels. For instance, each kernel may be used on a respective sub-area among a plurality of sub-areas within the image area, which may be useful in order to consider differences in the point spreading function across the image field (e.g. the blur may vary across the image field). Also, it is possible that a plurality of aperture array is present in the pattern definition device, which are used at different stages of the writing process, and then for each aperture array an associated kernel is used.

Advantageously, the calculation may be done at a higher data precision than the data used in the actual writing process, such as the gray scale data. In this case the convolution in step iii may be performed using arithmetic values which have an arithmetic precision higher than the resolution of the discrete gray scale.

Furthermore, the width of resolution of the graphical representation may be larger than a nominal width of the aperture images generated by the charged-particle multi-beam processing apparatus. Moreover, in a preferred realization of the writing process underlying several embodiments of the invention, the position of aperture images is kept fixed relative to the target at the position of a pixel during an exposure interval, but between exposure intervals the position of aperture images is shifted over the target, thus exposing the multitude of pixels within said image area on the target.

BRIEF DESCRIPTION OF THE DRAWINGS

In the following, the present invention is described in more detail with reference to the drawings, which show:

In the following, the present invention is described in more detail with reference to the drawings, which schematically show:

FIG. 8 shows a typical intensity profile of a VSB (variable shaped beam) mask writer;

FIG. 9 illustrates intensity profiles for a VSB mask writer corresponding to FIG. 8;

FIG. 9A shows a detail of FIG. 9 at the left-hand flank where the intensity profiles crosses the "0.5" intensity level;

FIG. 21 shows the kernel of FIG. 20 in a matrix representation;

FIGS. 22A-C illustrate the convolution of an intensity profile given as a matrix array (FIG. 22A) with the kernel (FIG. 22B), resulting in a matched intensity profile (FIG. 22C);

DETAILED DESCRIPTION

The embodiment of the invention discussed below implements a "Multi-Beam Writer to Reference Tool Matching Convolution Kernel", short MRMC kernel or simply "kernel", which is used in the on-line data path of a multi-beam exposure tool of the applicant of basically known type, but with suitable modifications so as to accommodate embodiments of the invention as described below. It should be appreciated that the invention is not restricted to the embodiments discussed in the following, which merely represent suitable implementations of the invention.

Lithographic Apparatus

Figure 1:
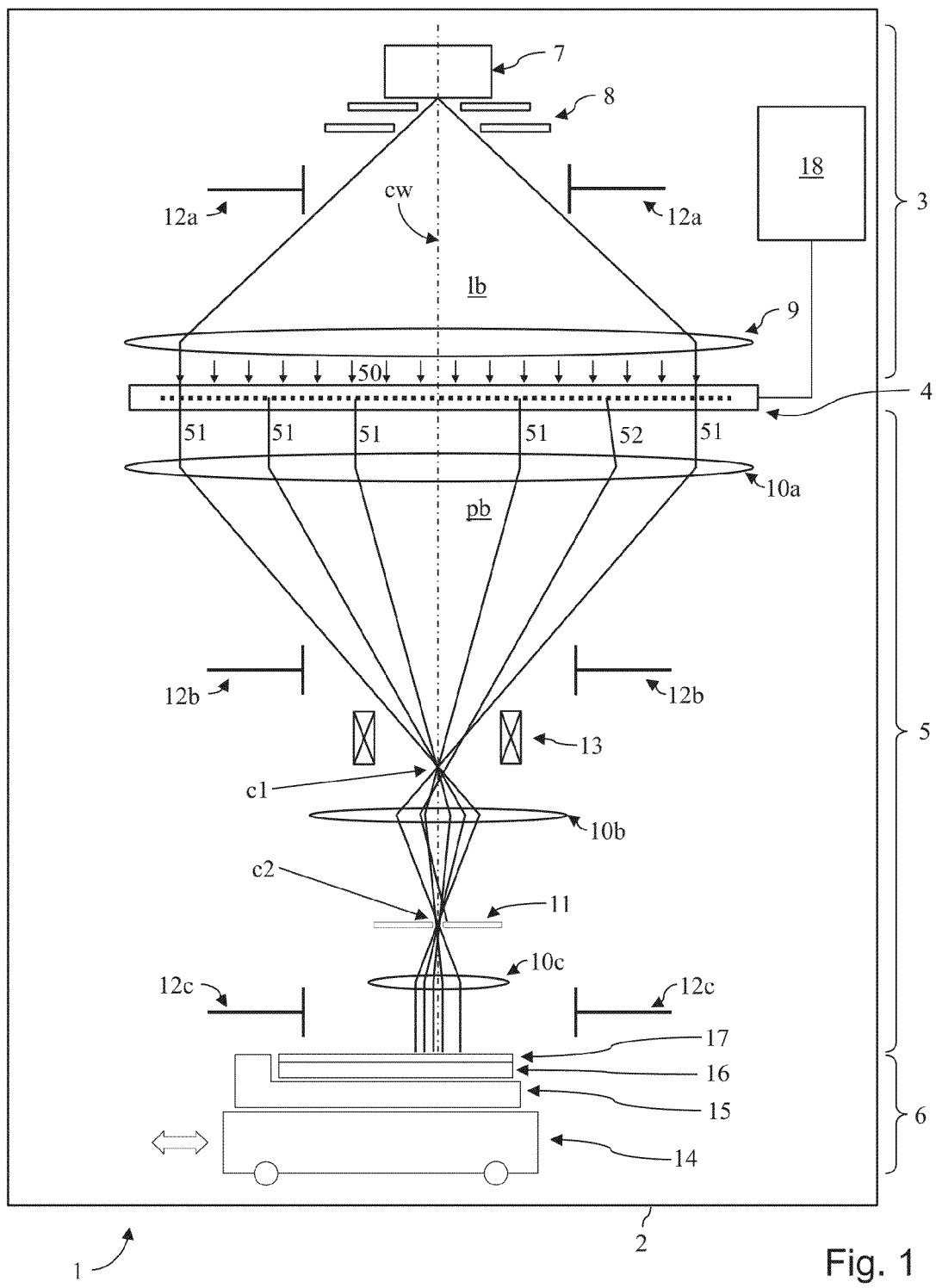
FIG. 1 a MBW system of state of the art in a longitudinal sectional view.

An overview of a lithographic apparatus suitable to employ the preferred embodiment of the invention is shown in FIG. 1. In the following, only those details are given as needed to disclose certain embodiments of the invention such that one of ordinary skill in the art can practice the various embodiments of the invention; for the sake of clarity, the components are not shown to size in FIG. 1. The main components of the lithography apparatus 1 are—corresponding to the direction of the lithography beam 1b, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam 1b, pb of charged particles along the optical axis cw of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

The extraction system 8 accelerates the particles to a defined energy of typically several keV, e.g. 5 keV. By means of a condenser lens system 9, the particles emitted from the source 7 are formed into a broad, substantially telecentric particle beam 50 serving as lithography beam 1b. The lithography beam 1b then irradiates a PD system 4 which comprises a number of plates with a plurality of openings (also referred to as apertures). The PD system 4 is held at a specific position in the path of the lithography beam 1b, which thus irradiates the plurality of apertures and/or openings and is split into a number of beamlets.

Some of the apertures/openings are "switched on" or "open" so as to be transparent to the incident beam in the sense that they allow the portion of the beam that is transmitted through it, i.e. the beamlets 51, to reach the target; the other apertures/openings are "switched off" or "closed", i.e. the corresponding beamlets 52 cannot reach the target, and thus effectively these apertures/openings are non-transparent (opaque) to the beam. Thus, the lithography beam 1b is structured into a patterned beam pb, emerging from the PD system 4. The pattern of switched on apertures—the only portions of the PD system 4 which are transparent to the lithography beam 1b—is chosen according to the pattern to be exposed on the substrate 16 covered with charged-particle sensitive resist 17. It has to be noted that the "switching on/off" of the apertures/openings is usually realized by a suitable type of deflection means provided in one of the plates of the PD system 4: "Switched off" beamlets 52 are deflected off their path (by sufficient albeit very small angles) so they cannot reach the target but are merely absorbed somewhere in the lithography apparatus, e.g. at an absorbing plate 11.

The pattern as represented by the patterned beam pb is then projected by means of an electro-magneto-optical projection system 5 onto the substrate 16 where the beam forms an image of the "switched-on" apertures and/or openings. The projection system 5 implements a demagnification of, for instance, 200:1 with two crossovers c1 and c2. The substrate 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by the data path realized by means of an electronic pattern information processing system 18. The data path is explained further below in section "Datapath".

In the embodiment shown in FIG. 1, the projection system 5 is composed of a number of consecutive electro-magneto-optical projector stages 10a, 10b, 10c, which preferably include electrostatic and/or magnetic lenses, and possibly other deflection means. These lenses and means are shown in symbolic form only, since their application is well known in the prior art. The projection system 5 employs a demagnifying imaging through crossovers c1, c2. The demagnification factor for both stages is chosen such that an overall demagnification of several hundred results, e.g. 200:1 reduction. A demagnification of this order is in particular suitable with a lithography setup, in order to alleviate problems of miniaturization in the PD device.

In the whole projection system 5, provisions are made to extensively compensate the lenses and or deflection means with respect to chromatic and geometric aberrations. As a means to shift the image laterally as a whole, i.e. along a direction perpendicular to the optical axis cw, deflection means 12a, 12b and 12c are provided in the condenser 3 and projection system 5. The deflection means may be realized as, for instance, a multipole electrode system which is either positioned near the source extraction system 12a or one of the crossovers, as shown in FIG. 1 with the deflection means 12b, or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charge-particle optics alignment system. These deflection means 10a, 10b, 10c are not to be confused with the deflection array means of the PD system 4 in conjunction with the stopping plate 11, as the latter are used to switch selected beamlets of the patterned beam pd "on" or "off", whereas the former only deal with the particle beam as a whole. There is also the possibility to rotate the ensemble of programmable beams using a solenoid 13 providing an axial magnetic field.

Figure 2:
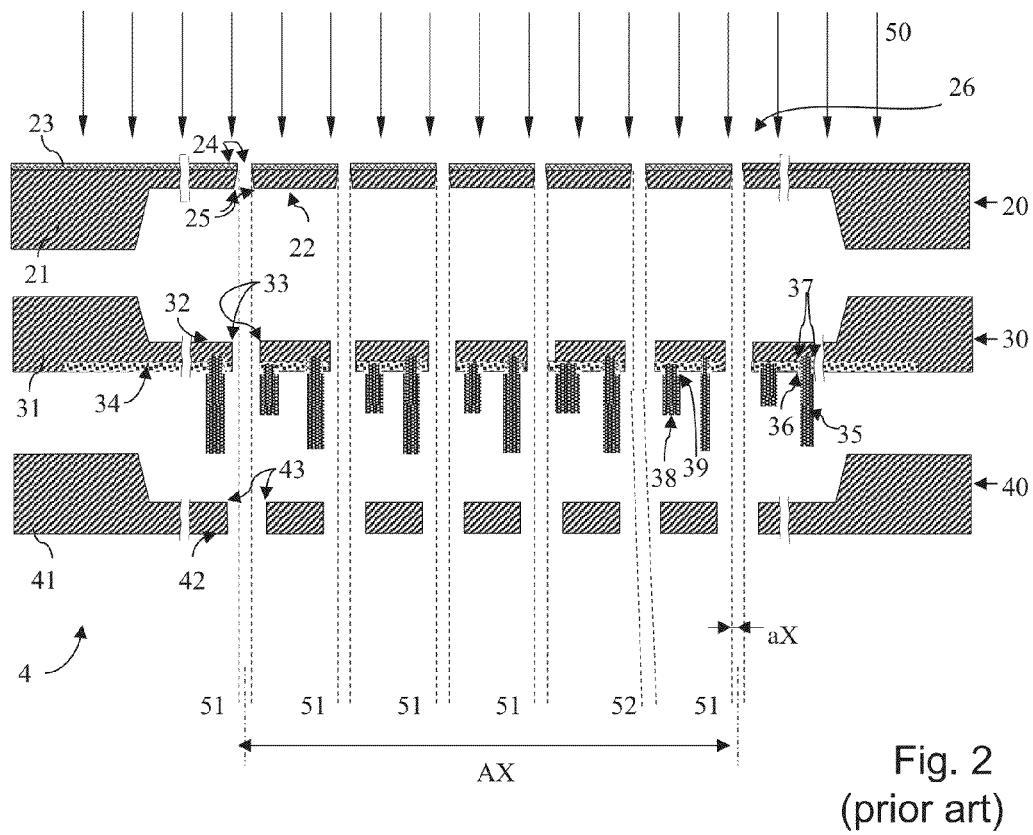
FIG. 2 a pattern definition system state of the art in a longitudinal section.

The sectional detail of FIG. 2 illustrates one suitable embodiment of a PD system 4, which comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction (vertical axis in FIG. 2).

The flat upper surface of AAP 20 forms a defined potential interface to the charged-particle condenser optics/illumination system 3. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and the bulk parts 21, 22.

Figure 4:
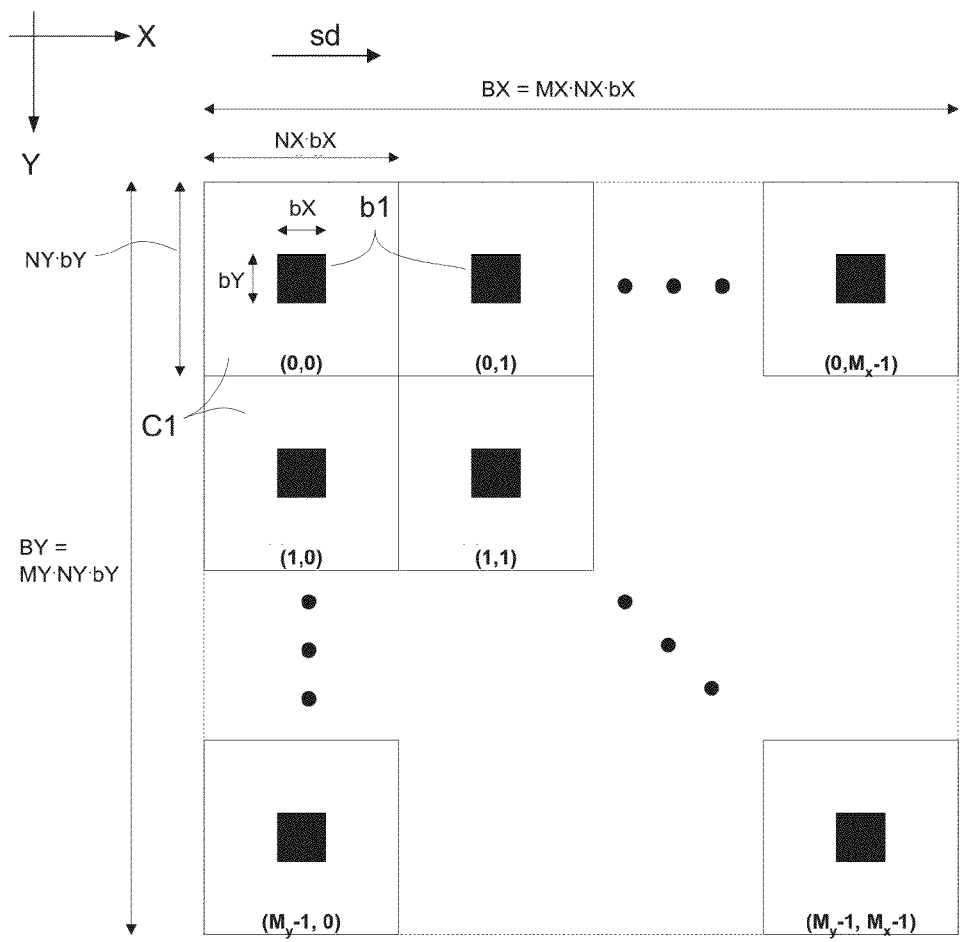
FIG. 4 shows an exemplary arrangement of apertures as imaged onto the target.

The AAP 20 is provided with a plurality of apertures 24 formed by openings traversing the thinned part 22. The apertures 24 are arranged in a predetermined arrangement within an aperture area provided in the thinned part 22, thus forming an aperture array 26. The arrangement of the apertures in the aperture array 26 may be, for instance, a staggered arrangement or a regular rectangular or square array (cf. FIG. 4). In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual beamlets passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to 24 (by approx. 2 µm at each side for instance). CMOS electronics 34 is provided to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding beamlet, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beamlets.

The arrangement of a PD system 4 with a DAP 30 shown in FIG. 2 is only one of several possibilities. In a variant (not shown) the ground and deflection electrodes 35, 38 of the DAP may be oriented upstream (facing upward), rather than downstream. Further DAP configurations, e.g. with embedded ground and deflection electrodes, can be devised by the skilled person (see other patents in the name of the applicant, such as U.S. Pat. No. 8,198,601 B2).

The third plate 40 serving as FAP has a flat surface facing to the first lens part of the down-stream demagnifying charged-particle projection optics 5 and thus provides a defined potential interface to the first lens 10a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate of it, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beamlets 51 when transmitted through the apertures 24. The beamlets 51 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beamlet 52 passing through (FIG. 2). The deflected beamlet can traverse the DAP and FAP unhindered as the openings 33 and 43, respectively, are made sufficiently wide. However, the deflected beamlet 52 is filtered out at the stopping plate 11 of the sub-column (FIG. 1). Thus, only those beamlets which are unaffected by the DAP will reach the substrate.

The reduction factor of the demagnifying charged-particle optics 5 is chosen suitably in view of the dimensions of the beamlets and their mutual distance in the PD device 4 and the desired dimensions of the structures at the target. This will allow for micrometer-sized beamlets at the PD system whereas nanometer-sized beamlets are projected onto the substrate.

The ensemble of (unaffected) beamlets 51 as formed by AAP is projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The nominal width of a beamlet at the substrate (i.e. aperture image) is given by $bX=aX/R$ and $bY=aY/R$, respectively, where aX and aY denote the sizes of the beamlet 51 as measured along the X and Y directions, respectively, at the level of the DAP 30.

It is worthwhile to note that the individual beamlets 51, 52 depicted in FIG. 2 represent a much larger number of beamlets, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beamlets. The applicant has realized such columns with a beam array field of approx. 82 μm×82 μm at the substrate. These examples are stated for illustrative purpose, but are not to be construed as limiting examples.

Figure 3:
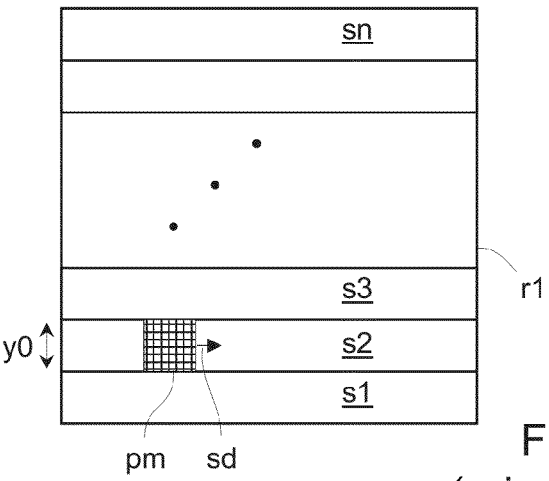
FIG. 3 illustrates the basic writing strategy on the target using stripes.

Referring to FIG. 3, a pattern image pm as defined by the PD system 4 is produced on the target 16. The target surface covered with the charged-particle sensitive resist layer 17 will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. It is emphasized that for the purpose of a number of embodiments of the invention only the relative motion of the pattern image pm on the target is relevant. By virtue of the relative movement the pattern image pm is moved over the area r1 so as to form a sequence of stripes s1, s2, s3, ... sn (exposure stripes). of width y0. The complete set of stripes covers the total area of the substrate surface. The scanning direction sd may be uniform or may alternate from one stripe to the next.

Figure 5:
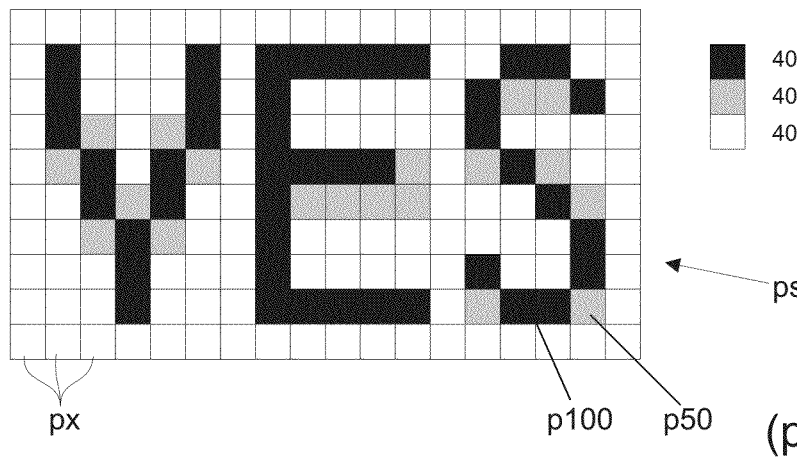
FIG. 5 shows an example of a pixel map of an exemplary pattern to be exposed.

FIG. 5 shows a simple example of an imaged pattern ps with a size of 10×16=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). Of course, in a realistic application of several embodiments of the invention, the number of pixels of the standard image would be much higher. However, in FIG. 5 the number of pixels is only 180 for the better clarity. Also, in general, much more gray levels will be used within the scale from 0% to 100%.

Thus, the pattern image pm (FIG. 3) is composed of a plurality of pattern pixels px, which are exposed with dose values according to the desired pattern to be exposed. It should be appreciated, however, that only a subset of the pixels px can be exposed simultaneously since only a finite number of apertures is present in the aperture field of the PD system. The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

While the substrate 16 is moved continuously, the same image element corresponding to a pattern pixel px on the target may be covered many times by the images of a sequence of apertures. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 4 out of 16 apertures would give a gray level of 25%. Another approach is reducing the duration of unblanked exposure for the apertures involved. Thus, the exposure duration of one aperture image is controlled by a gray scale code, for example an integer number. The exposed aperture image is the manifestation of one of a given numbers of gray shades that correspond to zero and the maximum exposure duration and dose level. The gray scale usually defines a set of gray values, for instance 0, $1/(n_y-1)$ ..., $i/(n_y-1)$, ..., 1 with $n_y$ being the number of gray values and i an integer ("gray index", $0 \leq i \leq n_y$). Generally, however, the gray values need not be equidistant and form a non-decreasing sequence between 0 and 1.

FIG. 5 shows the arrangement of apertures in the aperture field of the PD device, according to a basic layout and also illustrates several quantities and abbreviations used in the following. Shown is the arrangement of the aperture images b1 as projected onto the target, shown in dark shades. The main axes X and Y correspond to the direction of advance of the target motion (scanning direction sd) and the perpendicular direction, respectively. Each aperture image has widths bX and bY along the directions X and Y respectively. The apertures are arranged along lines and rows having MX and MY apertures, respectively, with the offset between neighboring apertures in a line and row being NX and NY respectively. As a consequence, to each aperture image belongs a conceptual cell C1 having an area of NX·bX·NY·bY, and the aperture arrangement contains MX·MY cells arranged in a rectangular way. In the following, these cells C1 are referred to as "exposure cells". The complete aperture arrangement, as projected onto the target, has dimensions of BX=MX·NX·bX by BY=MY·NY·bY. In the discussion hereinafter, we will assume a square grid as a special case of a rectangular grid, and set b=bX=bY, M=MX=MY, and N=NX=NY with M being an integer, for all further explanations without any restriction of the generality. Thus, an "exposure cell" has a size of N·b×N·b on the target substrate.

Figure 6A:
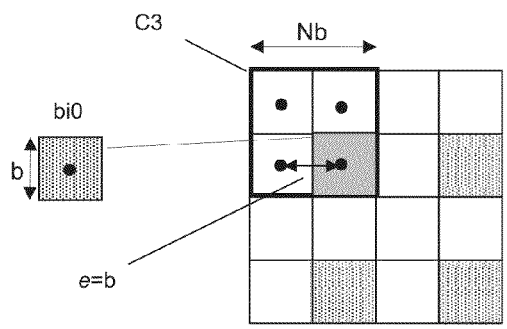
FIG. 6A illustrates an arrangement of apertures with M=2, N=2.

The distance between two neighboring exposure positions is denoted as e in the following. In general, the distance e can be different from the nominal width b of an aperture image. In the simplest case, b=e, which is illustrated in FIG. 6A for the example of an arrangement of 2×2 exposure cells C3, and one aperture image bi0 covers (the nominal position of) one pixel. In another interesting case, illustrated in FIG. 6B (and in line with the teachings of U.S. Pat. No. 8,222,621 and U.S. Pat. No. 7,276,714), e may be a fraction b/o of the width b of the aperture image, with o>1 being preferably (but not necessarily) an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels. The entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area.

Figure 6B:
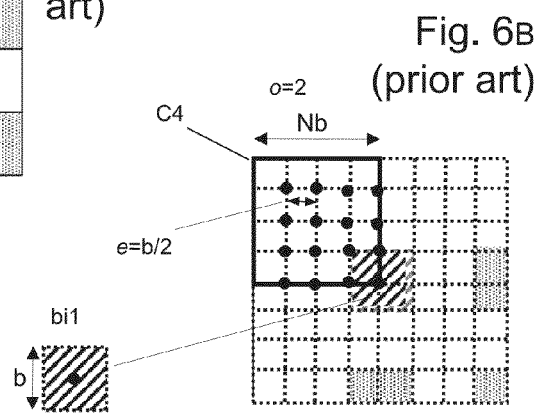
FIG. 6B shows an example of oversampling of the pixels in a "double grid" arrangement.

FIG. 6B illustrates one example of an oversampling of o=2 combined with placement grids, namely, the image of an aperture array with an exposure cell C4 having parameters o=2, N=2. Thus, on each nominal location (small square fields in FIG. 6B) four aperture images bi1 (dashed lines) are printed, which are offset on a regular grid by pitch e in both X and Y directions. While the size of the aperture image still is of the same value b, the pitch e of the placement grid is now b/o=b/2. The offset to the previous nominal location (offset of the placement grid) is also of size b/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice (generally, o times) as fine as before, while the aperture images themselves overlap. The exposure cell C4 now contains $(No)^2$ locations (i.e., "pixels") to be addressed during the write process and thus, by a factor of $o^2$, more pixels than before. Correspondingly, the area bi1 with the size of an aperture image b×b is associated with $o^2=4$ pixels in the case of oversampling with o=2 in FIG. 6B (also called "double grid"). Of course, o may take any other integer value as well, in particular 4 ("quad grid", not shown) or 8, or also a non-integer value greater one, such as $\sqrt{2}=1.414$.

Figure 7:
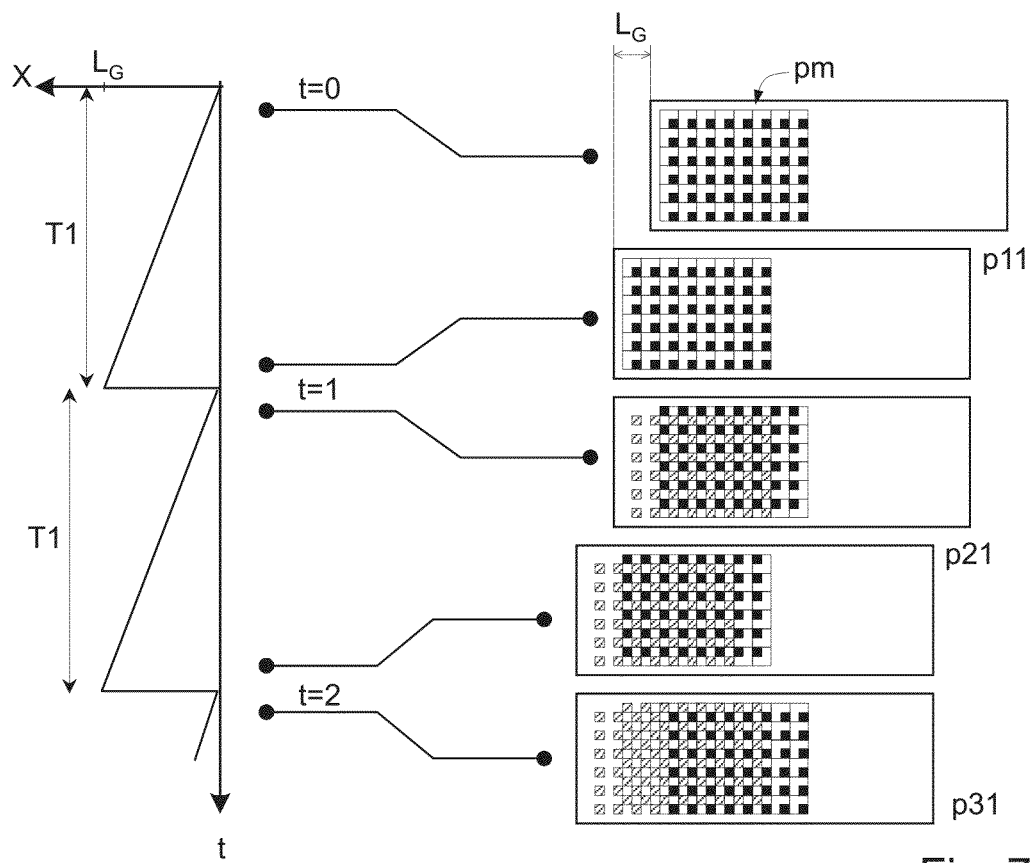
FIG. 7 illustrates the exposure of one stripe.

FIG. 7 shows an exposure scheme of the pixels, which is suitable for certain embodiments of the invention. Shown is a sequence of frames, with increasing time from top (earlier) to bottom (later). The parameter values in this figure are o=1, N=2; also, a rectangular beam array is assumed with MX=8 and MY=6. The target moves continuously to the left, whereas the beam deflection is controlled with a seesaw function as shown on the left side of the figure. During each time interval of length T1, the beam image stays fixed on a position on the target (corresponding to a position of a "placement grid"). Thus, the beam image is shown to go through a placement grid sequence p11, p21, p31. One cycle of placement grids is exposed within a time interval L/v=NMb/v, by virtue of the target motion v. The time $T_1$ for exposure at each placement grid corresponds to a length $L_G = vT_1 = L/(No)^2 = bM/No^2$, which we call "exposure length".

The beamlets are moved over the distance of $L_G$ during the exposure of one set of image elements together with the target. In other words, all beamlets maintain a fixed position with regard to the surface of the substrate during the time interval T1. After moving the beamlets with the target along distance $L_G$, the beamlets are relocated instantaneously (within a very short time) to start the exposure of the image elements of the next placement grid. After a full cycle through the positions p11 . . . p31 of a placement grid cycle, the sequence starts anew, with an additional longitudinal offset L=bNM parallel to the X direction (scanning direction). At the beginning and at the end of the stripe the exposure method may not produce a contiguous covering, so there may be a margin of length L that is not completely filled.

In contrast to reference writing tools as e.g. the VSB mask writer tool, the MBW setup which is the starting point of several embodiments of the invention uniformly uses the same spot size, e.g. 20 nm×20 nm. In addition an overlap between the spots may be used, with a selected amount of overlap: In the "Double Grid" multi-beam exposure, the overlap between the spots is half of the beam size in X as well as in Y direction. In the "Quad Grid" multi-beam exposure, the overlap between the spots is a ¼ of the beam size in X as well as in Y direction. The size of a single aperture image formed on the target is aX/R, where aX is the opening width of the apertures in the aperture array plate (AAP) and R is the reduction factor of the charged-particle projection optics. Each spot is exposed with discrete dose levels. For instance, when using 4 bits for programming the dose levels, the dose level of each spot can be selected to be 0, 1, 2, . . . 14, or 15 units, with 15 units representing the maximum dose level of 100%.

Figure 10:
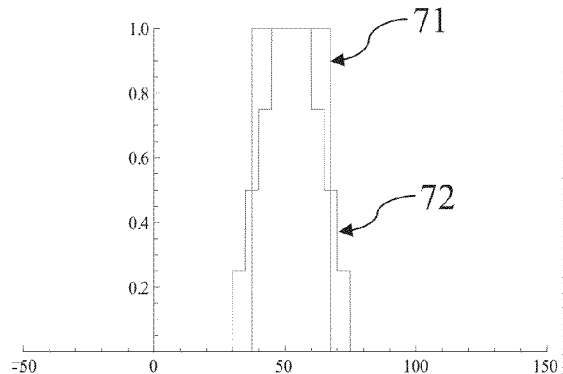
FIG. 10 illustrates an intensity profile of the MBW of the type shown in FIG. 1, and a dose level profile for a 30 nm line.
Figure 11:
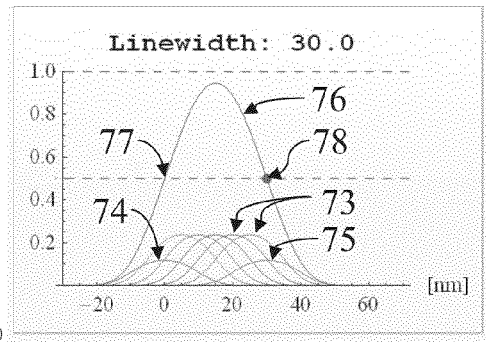
FIG. 11 shows an intensity profile for the 30 nm line dose level profile of FIG. 10.

FIG. 10 shows the ideal intensity profile 71 for a line of a width 30 nm, in the idealized case of zero blur. When using "Quad Grid" multi-beam exposure the overlap is a quarter of the beam size. Thus, for the case of 20 nm beam size the physical grid size is 5 nm. A discrete dose level can be assigned to each area of the physical grid, which is 5 nm×5 nm for the example chosen; the line 72 in FIG. 10 indicates the superposition of the intensity (or total dose) as it is composed by the overlapping exposure spots with discrete dose levels assigned to the pixel positions for generating the 30 nm line, whereas for better visibility the blur has been set to zero (so that the dose distribution of a single exposure spot becomes a rectangle). If the blur has a realistic value such as shown in FIG. 12, the step function at the edge of the rectangle is convoluted with a Gaussian function, which eventually transforms to a Gaussian shape. In that sense the line 72 can be seen as superposition of Gaussian functions at blur zero. In the general case the dose level histogram will not be symmetrical in order to position the left and right edge at predefined positions. In FIG. 11 a simulation is shown for a line of 30.0 nm width, with the left edge to be positioned at 0.0 nm and the right edge at 30.0 nm. For the simulation, it was assumed that beam spots of 20 nm are exposed with 5.1 nm 1sigma blur (i.e., 12.0 nm FWHM blur). The intensity profile 76 is formed by overlapping the profiles of the exposure spots 73, 74, and 75. The dose level of the leftmost exposure spot 74 is adjusted such that the 30 nm line starts at the desired start position 77, i.e. at 0 nm. The dose level of the rightmost exposure spot 75 is adjusted such that exposed line ends at position 78 at 30.0 nm. As can be seen in FIG. 11, in accordance with "Quad Grid" exposure, the overlap of the exposure spots 73, 74, 75 is a quarter of the beam size, i.e. 5 nm.

Figure 12A:
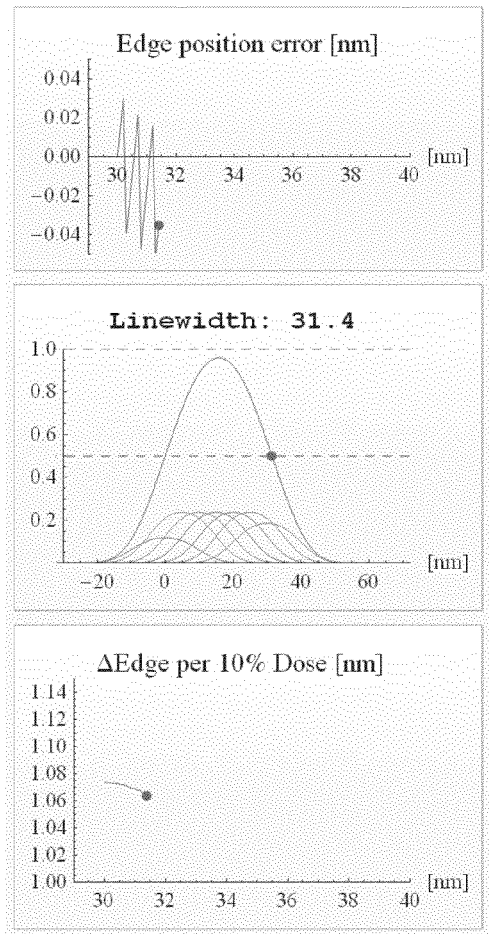
FIGS. 12A and 12B illustrate MBW intensity profiles and related data as obtained for a simulation of a line, with a line width of 31.4 nm (FIG. 12A) and 40.0 nm (FIG. 12B), respectively.
Figure 12B:
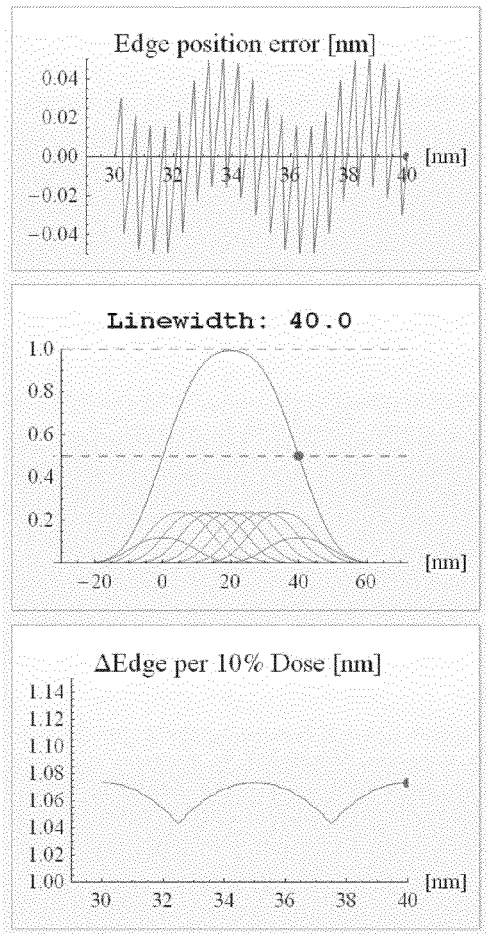

FIGS. 12A and 12B illustrate how a number of embodiments of the invention enable the MBW device to write lines with precise edge definitions; in each figure, the top frame shows the edge position error vs. line width, the middle frame the intensity profile, and the bottom frame shows the edge position deviation when enhancing the exposure dose by 10% vs. line width. FIG. 12A shows the intensity profile obtained for a 31.4 nm line width, and FIG. 12B for a 40.0 nm line width. Using the MBW with 20 nm beam size and Quad Grid exposure (5 nm physical grid size), the line width of the structure generated by the exposure can be changed in steps of 0.1 nm. Because of the integer dose levels there are slight deviations from the 0.1 nm address grid. These deviations are indicated as "edge position error" (top frames), as functions of the desired line width, in 0.1 nm steps between 30.0 nm and 40.0 nm. As can be seen the deviations are within ±0.05 nm. Furthermore, the change of edge position with 10% change of dose is only approx. 1 nm, varying only slightly with change of line width as shown in the bottom frames. In other words, since the dose is controlled in a MBW to better than 1%, the change of edge position with 1% change of dose is within approx. one atomic layer.

Figure 13:
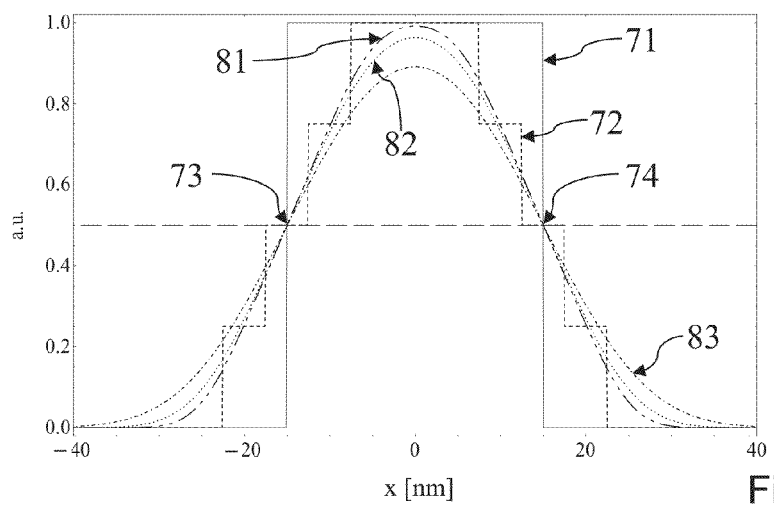
FIG. 13 illustrates the generation of a 30 nm line with the MBW.
Figure 13A:
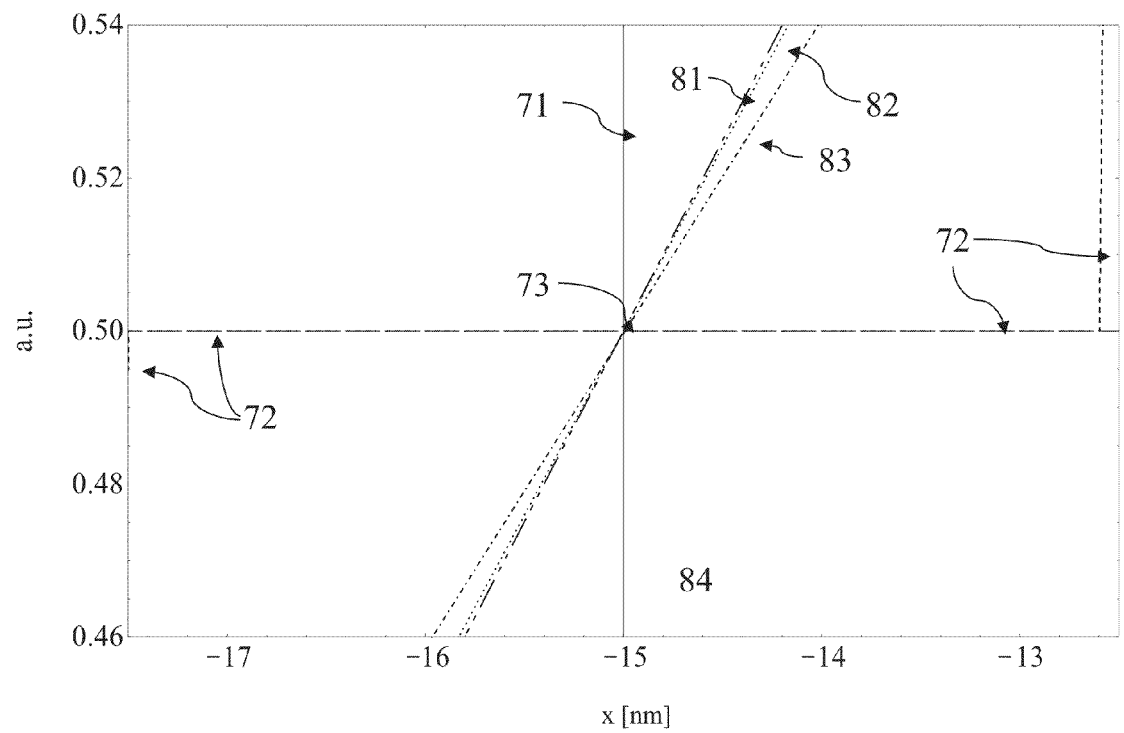
FIG. 13A shows a detail of FIG. 13 at the left-hand flank where the intensity profiles crosses the "0.5" intensity level.

FIG. 13 illustrates one advantage of the MBW, namely, that the line width is virtually independent of blur at the 50% dose threshold. Shown in FIG. 13 are the intensity profile 71 for zero blur, the dose level histogram 72, and resulting intensity profiles 81, 82, 83 calculated with 3.5 nm, 5.0 nm, and 7.5 nm 1sigma blur, respectively. The edge positions 73 and 74 of the generated structure are where the zero blur intensity profile 71 crosses the "0.5" intensity level. The enlarged detail of FIG. 13A shows the region around the position 73 at the left-side flank. The dose level assignments 72 are for using 20 nm beam size with 1sigma blur of 5 nm and Quad Grid multi-beam exposure, providing a 5 nm physical grid size.

Therefore, in order to customize the MBW to the reference tool conditions, which in this example are the VSB mask writer conditions, several embodiments of the invention suggest to modify the MBW profile so as to generate the same aerial image (=dose distribution including blur) as the reference tool (VSB mask writer).

Matching MBW to a Reference Tool, e.g. VSB Writer Tool

The customization of the MBW is accomplished according to many embodiments of the invention by a convolution of the graphical representation of the desired pattern, such as rasterized bitmap data, with a MRMC kernel. This kernel according to a number of embodiments of the invention enables to eventually generate the same dose distribution as if the original vector data was written by a reference tool, as e.g. a VSB mask writer tool. The graphical representation of the desire pattern may be in any of various formats as used in the state of the art. In the above example discussed with regard to FIGS. 8 and 10, it is suitable to use a dose level pattern like the dose level profile 72.

Figure 14:
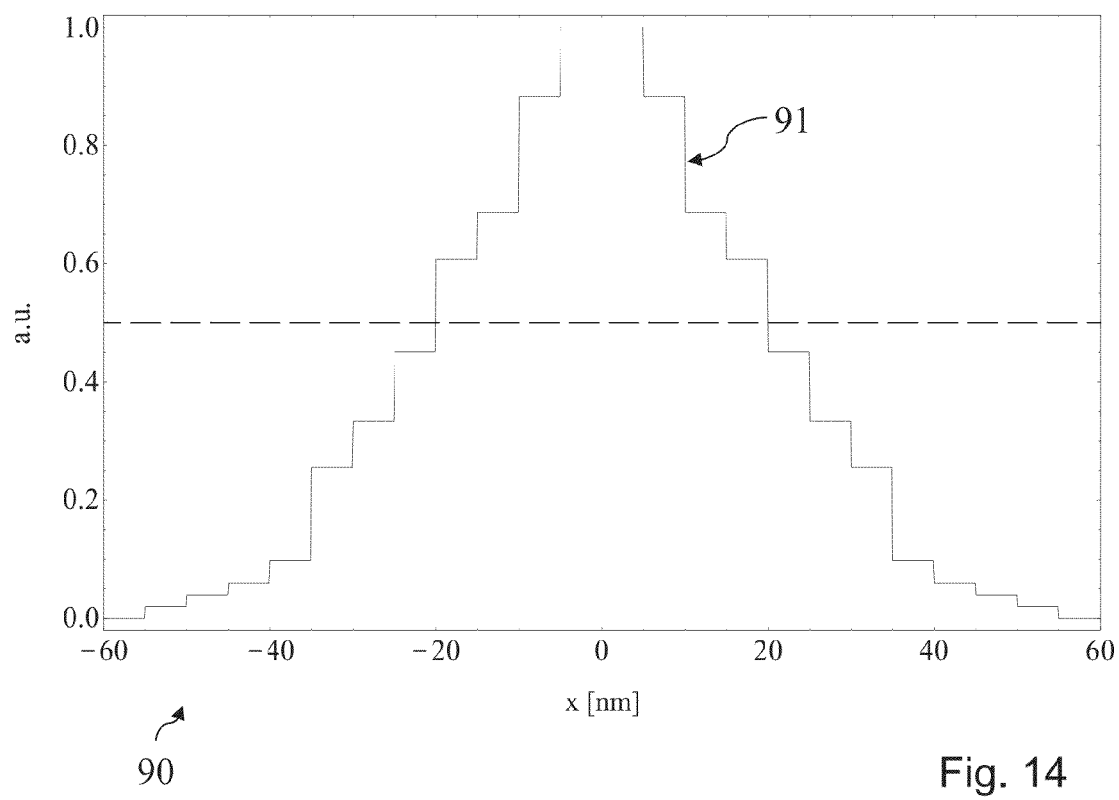
FIG. 14 shows a kernel according to certain embodiments of the invention suitable for matching the MBW to a reference tool, in particular a VSB writer.

FIG. 14 shows an example of a kernel 91 according to several embodiments of the invention, in this case for having a MBW with 20 nm beam size and Quad grid exposure (5 nm physical grid size) emulate a VSB reference tool having a 1sigma blur of 20 nm. The kernel is shown in a histogram representation 90, equivalent to a representation as a one-dimensional array of integer of real values. The methods how to determine the kernel are explained below. The kernel may also have a simple shape, such as a rectangle shape (i.e., taking a constant value within finite interval, but zero elsewhere, see FIG. 26A) or triangle shape (i.e., a linear rise from zero to a peak value and then falling linearly to zero again, zero elsewhere, see FIG. 26B), or other shape according to a suitable function, e.g. a sinc function (so-called cardinal sine, $\text{sinc}(x)=\sin(x)/x$, cf. FIG. 26C) or a Gaussian (cf. FIG. 26D). The kernel functions of FIGS. 26A-D are characterized by a spatial range parameter (width of rectangle or triangle, distance of first zero from the maximum, or FWHM parameter of the Gaussian) which is typically chosen corresponding to the blur value of the reference tool. For example in FIG. 26A the full range of the blur would be in the order of twice the full-width-half-maximum value of the blur when this kernel is used to match the blurring behavior of the reference tool. In case of the differential kernel of FIG. 26C the spatial distance between the first-order zeros is a measure of the dose slope that is generated by filtering, or in special cases causes a selectivity for features that correlate with this length. In particular, the kernel in FIG. 26C allows to pronounce features with size 30 nm, which is the approximate distance of the first-order zeros.

Figure 15:
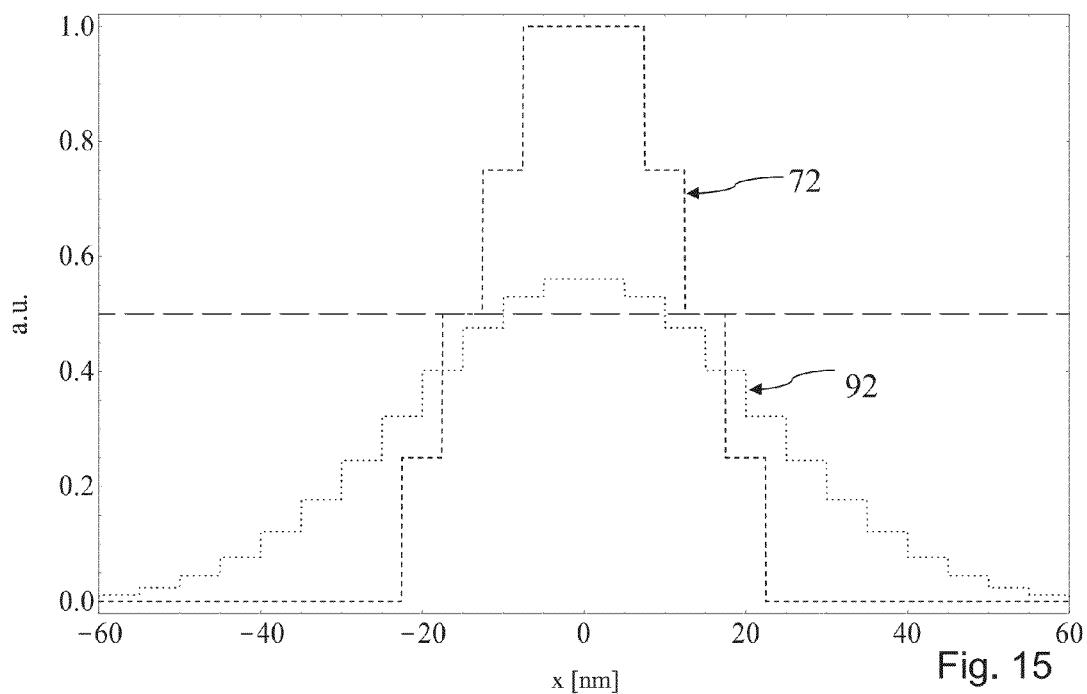
FIG. 15 depicts a dose level histogram of the MBW for a line with a target width of 30 nm, and the dose level histogram resulting from the convolution with the kernel of FIG. 14.
Figure 16:
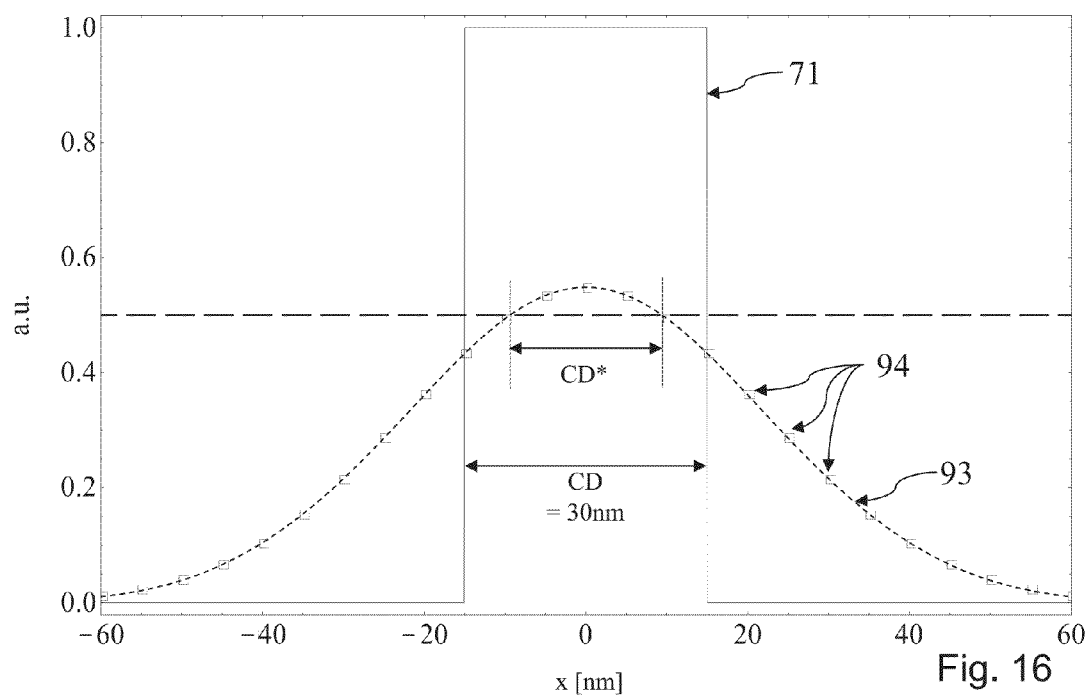
FIG. 16 shows the intensity profile resulting from the histograms of FIG. 15, where the dashed line indicates the profile produced by the matching MBW for emulating the reference tool and the marks indicate the intensity profile of the VSB device which is emulated.

FIG. 15 shows the dose level convolution 92 which is obtained by convoluting the kernel 91 with the MBW dose level assignment 72 for a line width of 30 nm. Assuming a 1sigma blur of 5.0 nm of the 20 nm exposure spots with the dose level assignment 92, an intensity profile as indicated by symbols 94 is obtained as shown in FIG. 16. The dotted line 93 represents the intensity profile 69 of the VSB writer with 20 nm 1sigma blur (FIG. 9). It is important to note that the two intensity profiles 93 and 94 coincide with only minimal deviation, barely visible in FIG. 16. FIG. 16 also illustrates the zero blur intensity profile 71 of the 30 nm line. The intensity profiles 93 and 94 are above the "0.5" dose level (which determines the development of the exposed charged-particle sensitive resist) for a line width CD* considerably smaller than CD=30 nm. Thus, the MBW was "degraded" with the convolution kernel in a manner which exactly matches the behavior of the reference tool, in this case the VSB mask writer.

Figure 17:
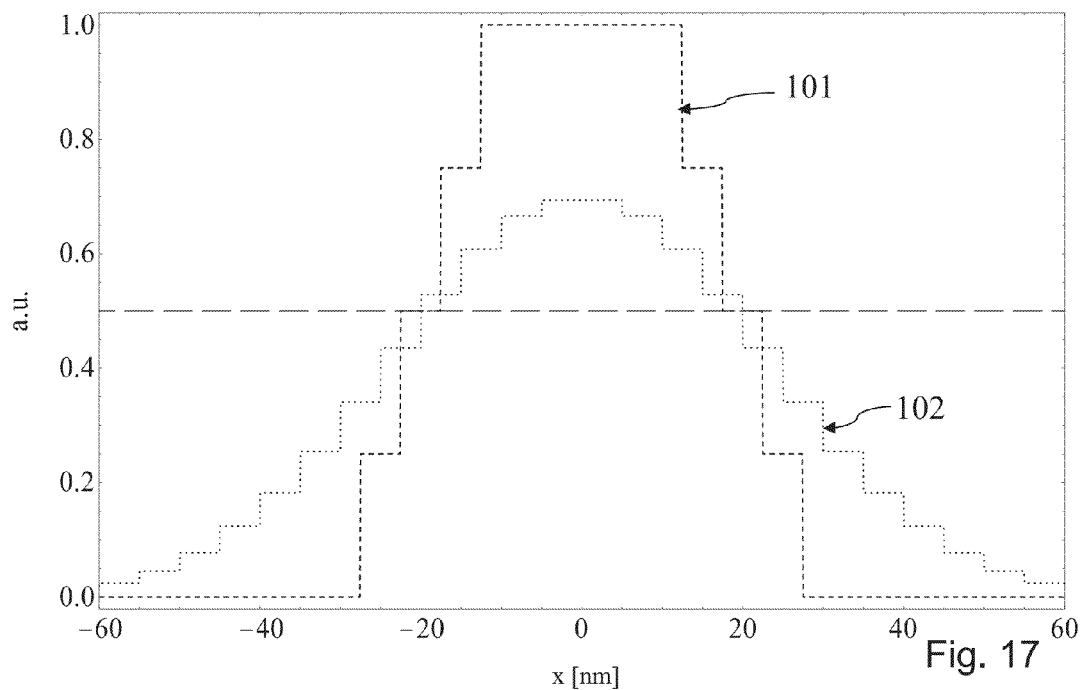
FIGS. 17 and 18 show dose level histograms and the resulting intensity profiles for a line with a target width of 40 nm, in depictions analogous to FIGS. 15 and 16, respectively.
Figure 18:
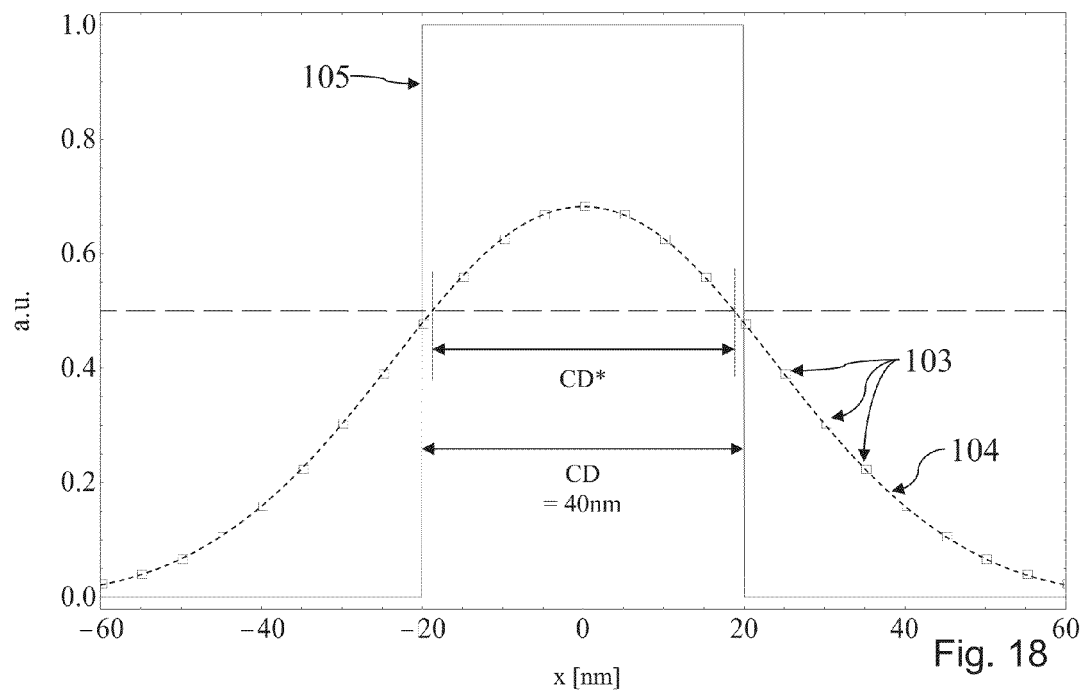

FIGS. 17 and 18 illustrate an example for CD=40 nm according to a dose level assignment 101, as shown in diagrams analogous to FIGS. 15 and 16. The same kernel 91 was used to generate a dose level convolution 102, leading to an intensity profile 103 which is virtually coinciding with the intensity profile 104 of the reference tool (VSB) writer. The line 105 indicates the target line of 40 nm.

Figure 19:
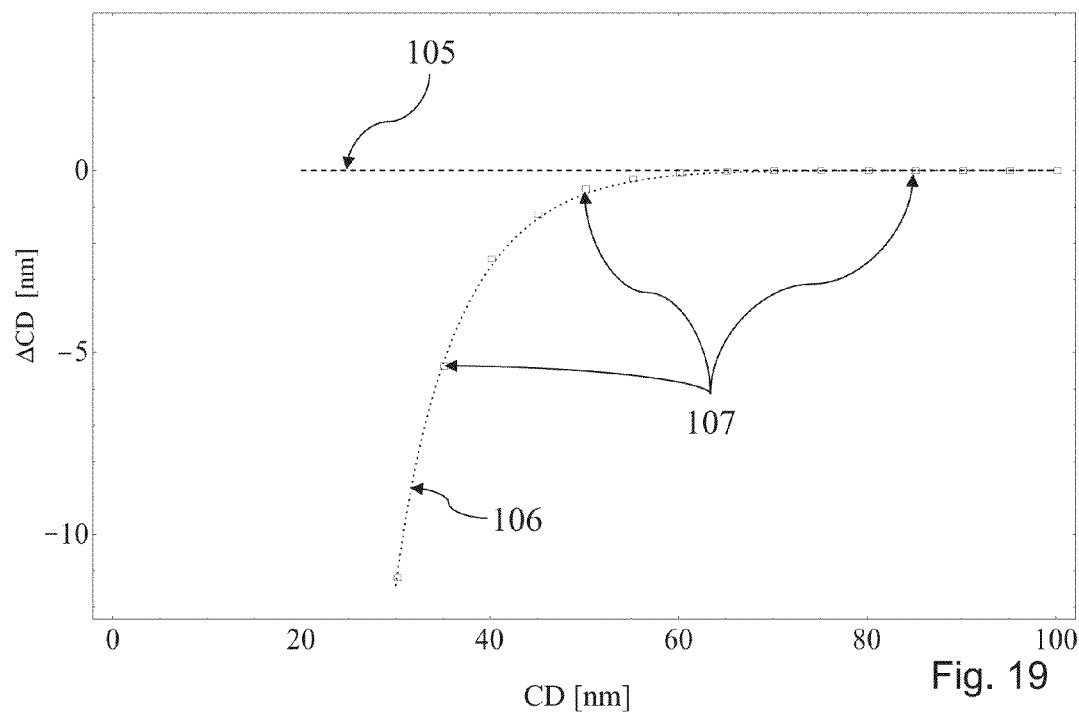
FIG. 19 illustrates the CD deviation as a function of the CD parameter for the MBW, the VSB reference tool, and the matching MBW.

FIG. 19 shows the relationship of $\Delta CD=(CD^*-CD)$ versus CD for the two writer types. The curve 105 illustrates the relationship for the MBW, in this case for a Quad Grid exposure with 20 nm beam spots with 1sigma blur of 5 nm: there is virtually no deviation, i.e. we have a flat relationship 105. In fact the deviations of the curve 105 from an ideal horizontal line are $<\pm 0.1$ nm, corresponding to twice the maximum edge position errors of $\pm 0.05$ nm as shown in the upper part of FIG. 12B. In contrast, for the reference tool, e.g. VSB writer with 1sigma blur of 20 nm, there are larger deviations for CD values below 100 nm, which is why the values 106 of $\Delta CD$ (CD) go down to negative values for decreasing CD. For instance, for CD=30 nm the CD* is approx. 19 nm (cf. FIG. 16), corresponding to a $\Delta CD$ of approx. $-11$ nm.

Figure 19A:
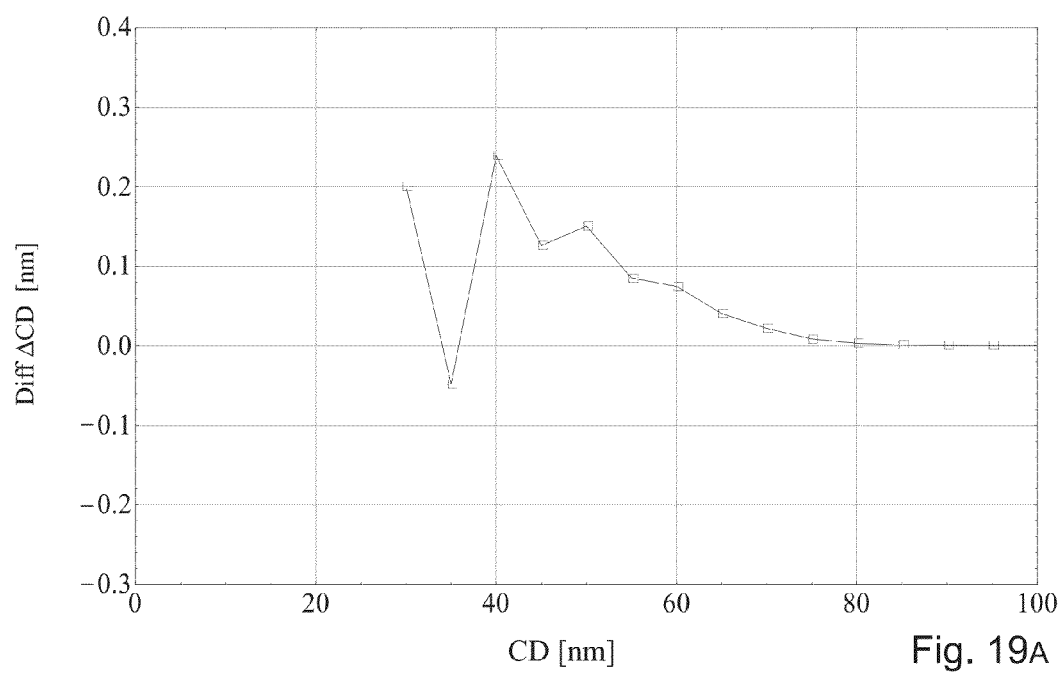
FIG. 19A shows the CD deviation of FIG. 19 at an enlarged scale.

Referring to FIG. 19, the MBW convoluted with the kernel 91 results in a performance 107 which is virtually the same as the reference tool (VSB) 106. FIG. 19A shows in detail the difference between the values of curves 107 and 106 of $\Delta CD$ as function of CD. The deviations are smaller than 0.25 nm for CD values equal or above 30 nm. This illustrates that the method according to a number of embodiments of the invention can emulate reference tools to a very good degree with only very small deviations from the significant parameters such as CD. In fact, the deviations could be further reduced by (i) further suitable optimizing the kernel, (ii) using smaller beam size with the MBW, or (iii) using a smaller physical grid on the target in the MBW.

Figure 20:
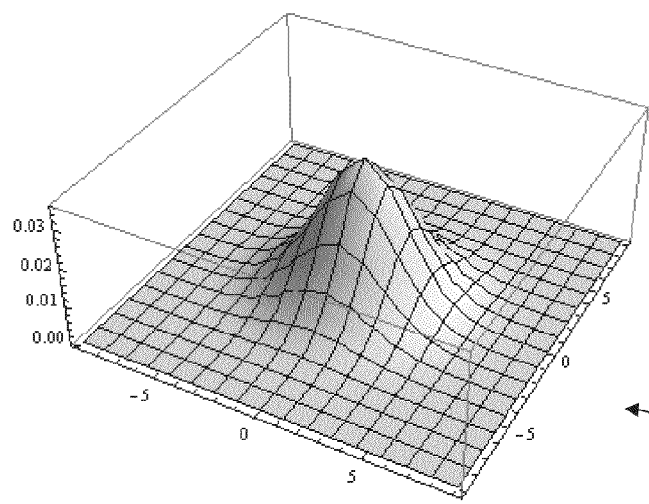
FIG. 20 shows a two-dimensional kernel in a representation as a 3D intensity profile.

In addition to the above one-dimensional examples, two-dimensional simulations were done. For this, an isotropic kernel 111 as illustrated in FIG. 20 may be used. The kernel 111 was generated by rotating the kernel 91 (FIG. 14). The kernel 111 may be represented also in the form of a matrix of (e.g., integer or real) values. For instance, FIG. 21 illustrates a representation of the kernel 111 as an integer matrix 112, where the individual values have been rounded to the next integer value (e.g. 212 is rounded from 211.765); the values need not be normalized to $\Sigma K_{k,l}=1$. The kernel 111 has size of 22×22, but it is expected that for most implementations smaller kernels, such as of sizes 5×5, 7×7 or 11×11, will be sufficient to meet processing requirements; but of course larger kernels may be suitable as well.

The kernel is determined prior to any pattern calculation, and is then applied to the pixel data. The calculation is performed by a convolution so as to obtain the pixel data for the MBW matched to the reference tool. In the example of a matrix kernel 112 with entries $K_{k,l}$, the calculation for the value of each value $P^o_{i,j}$ to be used at the position (i,j) (j-th pixel in the i-th row) for the MBW is:

$$P^o_{i,j} = \Sigma_{k,l}(P_{i+k,j+l} K_{k,l})/K^o, \qquad (1)$$

where $P_{i,j}$ denotes the value of pixel at position (i,j) in the original pattern, the sum runs of over the complete set of indices in the kernel matrix; the constant $K^o$ is the normalization of the kernel:

$$K^o = \Sigma_{k,l} K_{k,l} \qquad (2)$$

Figures 22A, 22B, 22C:
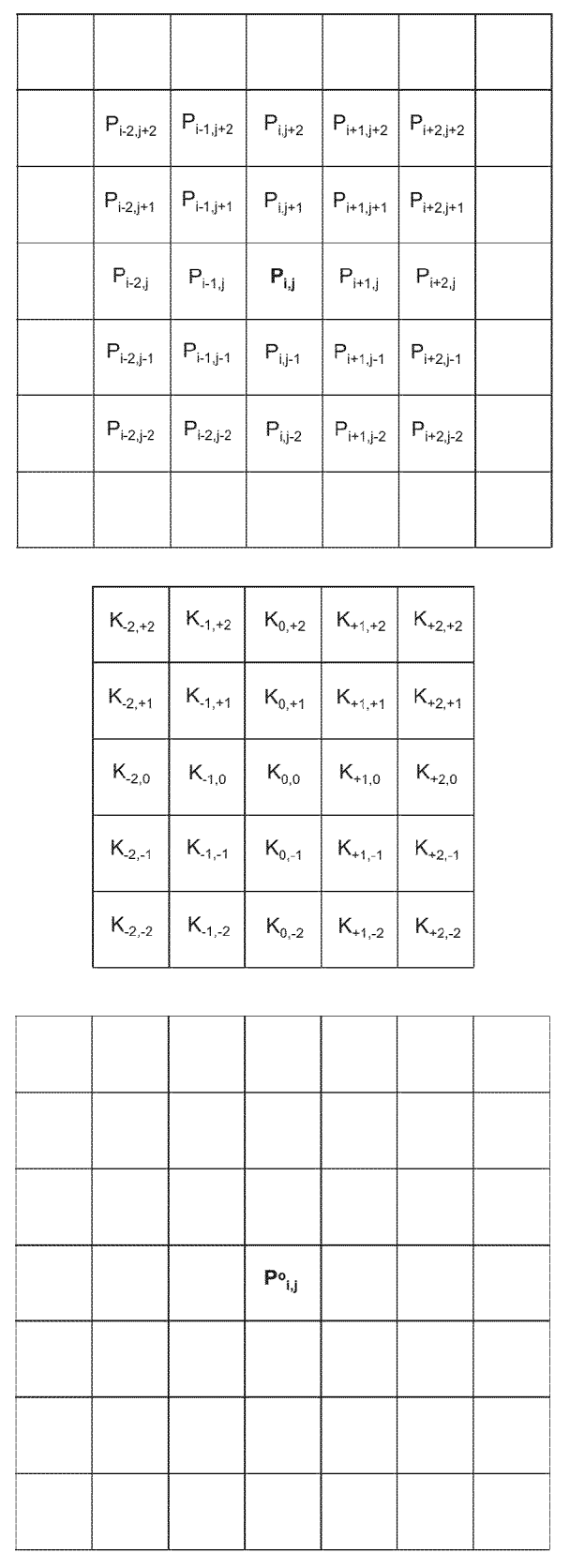

FIGS. 22A-C illustrate a simplified example for a kernel of size 5×5 (FIG. 22B). in order to obtain the value of one of the pixels in the convoluted pattern, $P^o_{i,j}$ in FIG. 22C, the kernel is applied to the pixel data; only those pixels in FIG. 22A are specified by symbols $P_{i+k,j+l}$ which are used in the convolution calculation according to formula (1) above (in this case the offset indices k and j in the sum independently run through values −2, ... +2).

Figure 23A:
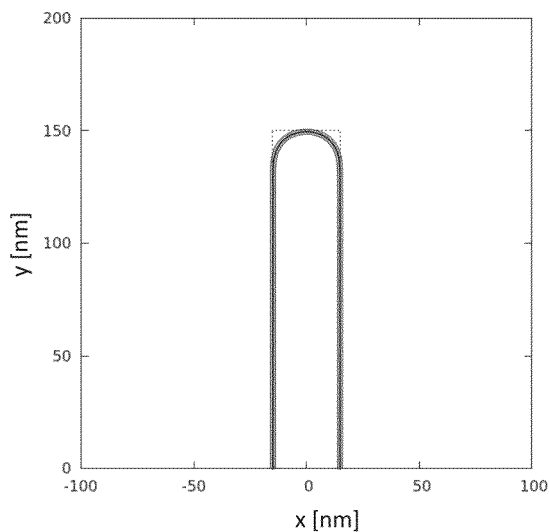
FIGS. 23A-C illustrate 2D representations of a 30 nm line when exposed with the MBW (FIG. 23A), a reference tool (VSB writer, FIG. 23B), and with the matching MBW (FIG. 23C), respectively.
Figure 23B:
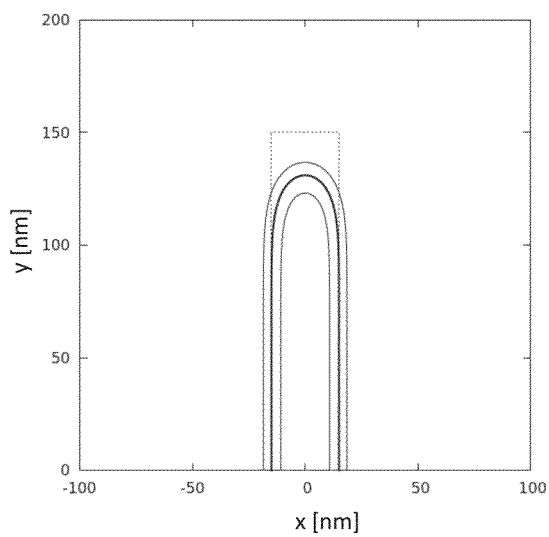
Figure 23C:
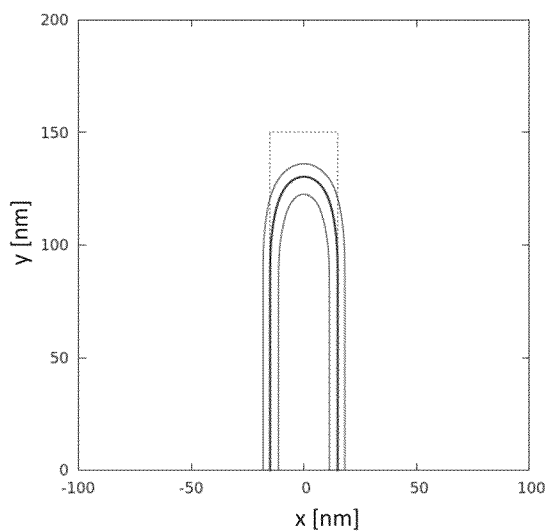

FIG. 23A-C show three 2D simulations for a line having 30 nm width; half of the line is shown only, as the other half is the symmetrical image. Shown are contour plots for 45%, 50%, and 55% dose level with regard to the maximum dose; the dotted rectangle indicates the target shape of the 30 nm line. FIG. 23A illustrates the result of simulations for a line 300 nm long when using the MBW with beam size of 20 nm with a 1sigma blur of 5 nm and Quad Grid exposure (i.e., 5 nm physical grid size). The 50% dose level is the resist contour obtained with development (assuming high resist contrast). FIG. 23B shows the result of corresponding simulations for the reference tool, e.g. a VSB writer with 1sigma blur of 20 nm; for the line with 30 nm line width the result exhibits a clear line edge shortening and degraded dose latitude, as compared to the MBW illustrated in FIG. 23A. FIG. 23C illustrates the result for (simulated) exposure with the MBW convoluted with the kernel 111 of FIG. 20 with the target to match the 30 nm line as exposed with reference tool line. The excellent match with the profile of FIG. 23B is evident.

MRMC Kernels for Multi-Beam Writers

A further aspect of several embodiments of the invention is the case where the reference tool is of the MBW type itself. For example, in the case of a mask shop where several MBW machines are installed many embodiments of the invention may be suitably used to match the performance of the various MBWs having possibly different imaging parameters. A further useful task is matching a MBW to older versions of reference tools.

Anisotropic Kernels, Multiple Kernels and Time-Dependence

Figure 24A:
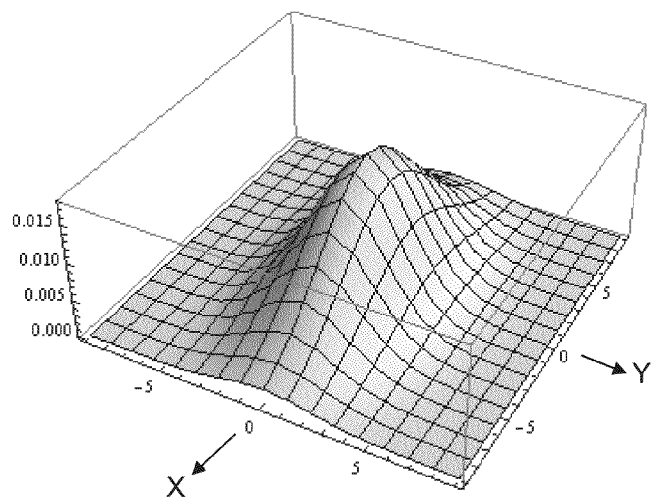
FIGS. 24A,B show kernels with anisotropy with a larger line width along the X direction and the Y direction, respectively.
Figure 24B:
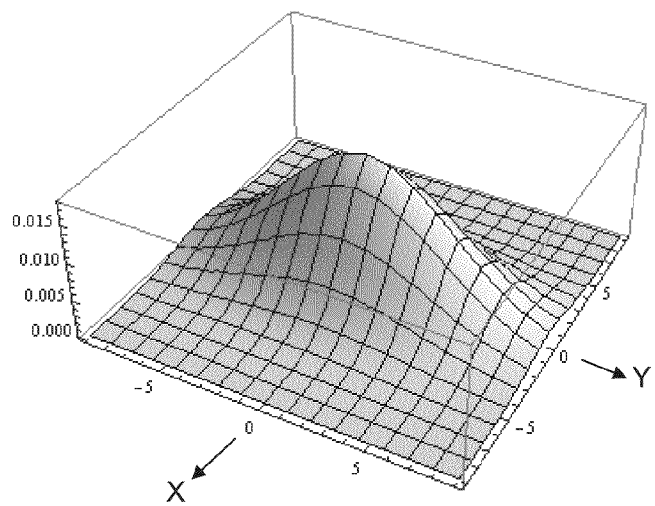
FIG. 24C shows a 2D matrix representation of the kernel of FIG. 24A.

A kernel according to a number of embodiments of the invention need not be isotropic within the XY plane. For example, there may be a situation where a MBW machine has written a mask and careful metrology analysis reveals that on the mask the width of lines in X direction are different from the width of comparable lines in Y direction to a certain extent; in order to emulate such a situation in another MBW device, one suitable approach according to another aspect of many embodiments of the invention is to employ an anisotropic kernel. Examples of anisotropic kernels are shown in FIG. 24A and FIG. 24B. In particular, FIG. 24A illustrates an anisotropic kernel 151 with a large line width along the X direction, about doubled of the line width along the Y direction; in contrast, the kernel 153 depicted in FIG. 24B has an anisotropy with the larger line width along the Y direction. FIG. 24C illustrates a matrix representation 152 of the kernel 151 of FIG. 24A, where, for instance, the individual values (not normalized) are given as real values rounded to one decimal digit. It is worthwhile to note that kernels are not restricted to lines in X or Y directions but may be applied also to anisotropies oriented at an arbitrary angle to X/Y direction.

On the other hand, an anisotropic kernel also offers a way to compensate a known anisotropy in a MBW device or reference tool of other type, for instance an anisotropy towards the X direction could be compensated using a kernel anisotropic towards the Y direction, or vice versa (or with regard to arbitrary perpendicular axes).

It is also important to note that the above examples of kernels are of illustrative purpose only; further implementations of kernels and application to other tasks of considerable importance will be obvious for the skilled person.

One of the many possible variants of a kernel includes time-dependent values. For instance, a time-variation f(t) during a writing process may be implemented, provided such time-variation is known from theoretical considerations and/or experimental data. This allows to take account of time-dependent processes such as ageing of a resist. If the variation of resist sensitivity is known as a function of time, f(t), this function may be used as an additional factor entering the relevant entries in the kernel, i.e., $K_{k,l}=K'_{k,l} \cdot f(t)$, where $(K'_{k,l})$ is an initial, time-independent kernel, for instance the kernel valid for the start of the exposure process. Alternatively or in combination, where the particle beam is generated from a source having a total current which may vary in time, the time-dependency may comprise a function corresponding to a fluctuation function of the total current emitted from the source, which has been experimentally determined prior to the calculation process.

Another aspect of many embodiments of the invention is that multiple kernels may be used within one writing process. For instance, different kernels may be used for different areas of the target. This is advantageous in cases where, for instance, the reference tool exhibits varying imaging behavior over the areas on the target to be exposed, such as a non-uniform anisotropy. Also, as already mentioned, the beam size might be changed during the writing process, e.g., from 20 nm to 10 nm, for instance by switching between different aperture arrays within the PD device (see U.S. Pat. No. 8,546,767). In this case, a first kernel is used for the exposure with 20 nm beam size, and a second kernel is used with the 10 nm beam size.

Datapath

Figure 25:
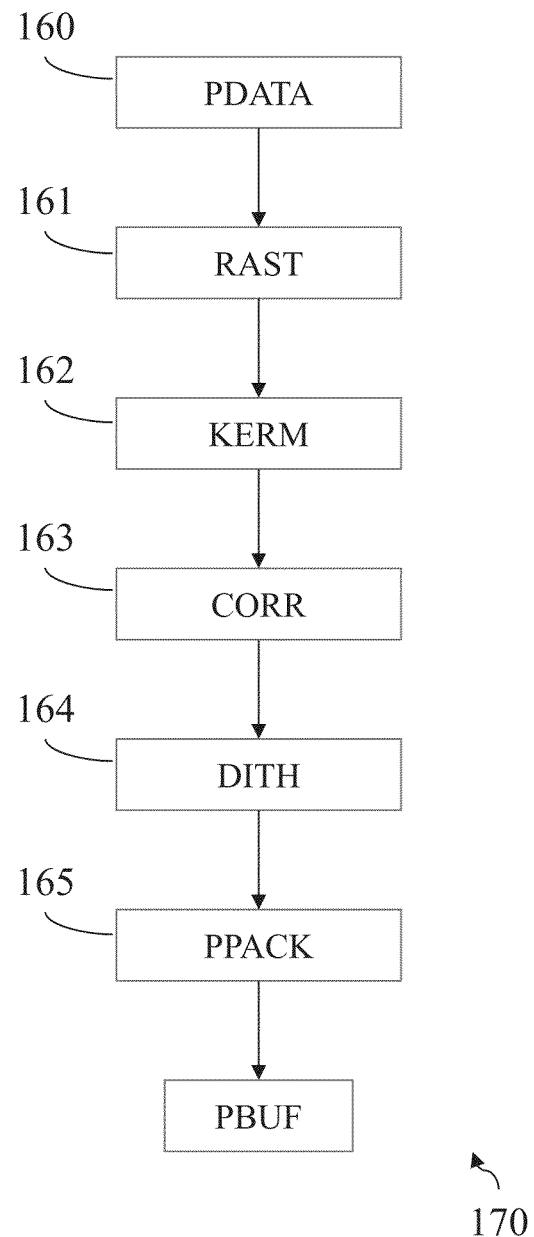
FIG. 25 shows the data path of the MBW.

FIG. 25 shows a flowchart of the datapath 170 in the context of many embodiments of the invention. The data path is preferably performed in the processing system 18 of the writer tool (FIG. 1) in real time; in a variant, part or all of the calculations of the data path may be performed in advance, for instance in a suitable computer.

The complete pattern image comprises a vast amount of image data, which is why for efficient computation of those data a high-speed datapath that generates the pixel data to be exposed, preferably in real-time, will be suitable. The pattern to be exposed is typically described in a vector format, e.g. as a collection of geometries like rectangles, trapezoids or general polygons, which typically offers better data compaction and therefore reduces the requirements on data storage. The datapath therefore consists of three major parts:

a vector-based physical correction process (step 160),
 rasterization processes to translate the vector to pixel data (steps 161 to 164), and
 buffering of pixel data for temporarily storage for the writing process (step 165).

The datapath starts upon being supplied a pattern PDATA to be exposed at step 160. In the case that a Reference Tool shall be matched, e.g. a VSB writer tool, the pattern data may have already been modified in a previous step (not shown) in order to correct for a specific writing behavior, as for example the line end shortening as shown in FIG. 23B. In step 160, generally, the pattern PDATA to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 161: Rasterization RAST. The geometries of every chunk are converted to a raster graphics array, where the pixel gray level represents the physical dose of the corresponding aperture image. Every pixel that is completely inside a geometry is assigned the color of the polygon, whereas the color of pixels that cross an edge of a geometry is weighed by the fraction of the area of the pixel that is covered by the geometry. This method implies a linear relation between the area of the geometry and the total dose after the rasterization. The doses are first calculated as floating point numbers; only later they are converted to the discrete set of dose values as supported by the PD device. As a result of rasterization the pixel data will be in the format of floating point numbers representing nominal dose values P for the respective pixels.

Stage 162: Kernel matching KERM. A pre-determined MRMC kernel is applied to the pixel data. This is done by a convoluting the pixel data with the kernels described above. Preferably, in order to achieve real-time processing speed, a sufficient number of parallel CPUs and GPUs are used. Since the convolution kernel typically acts on the range of the blur, which is a few tens on nanometers, it is possible to parallelize the calculation processes in an effective way where the pixel data of the beam array are distributed over different CPUs and/or GPUs.

Stage 163: Other pixel based corrections CORR, such as compensation of deviations from a uniform current density of the beam 50 over the aperture field, and/or correction for individual defective beam deflectors in the DAP 30. Correction methods of this kind do not form part of the invention and are not discussed here.

Stage 164: Dithering DITH. The dithering process converts the convoluted, and possibly corrected, dose value data $P^o$ into gray value data, based on a predetermined gray value scale. This is a position-dependent rounding process that ensures that rounding errors are averaged over nearby pixels which, combined with oversampling, allows for a much finer dose variation than with the discrete set of dose values available for a single aperture; it can be realized by means of known algorithms for the conversion of visual image data into pixel graphics. It is possible to apply additional corrections (which are not part of the present invention) at this stage, provided they can be applied in the pixel domain, immediately before or after dithering depending on the actual correction (e.g. defective apertures correction).

Stage 165: Pixel packaging, PPACK. The pixel image obtained from stage 164 is sorted according to the placement grid sequence and sent to a pixel buffer PBUF which is provided in the processing system 18 of the writer tool (FIG. 1). The pixel data is buffered until a sufficient amount of data, typically at least the length of a stripe, is present which triggers the exposure of the stripe (see FIG. 7). The data is taken out of the buffer during the writing process. After the stripe has been written, the process described above starts anew for the pattern data of the next region, such as the next stripe.

Calibration of the MRMC Kernel to Meet Matching Performance

The data preparation for a VSB tool, or (in general) a reference tool, usually uses a correction function to consider CD changes as function of the line width, as described above with FIG. 19. Additionally, the advanced semiconductor users apply sophisticated models to measure CD values, line end shortening and corner pull-back radius and related pattern properties, whereas deviations from the intended shape are compensated by modifying the vector input data, basically the dose assignment and optionally also the shape. This optimization is based on computation-intensive simulations that often require many hours or days of computation time, depending on how many parallel computers are used, and the calculations are based on specific beam and process properties such as dose distribution (point spreading function), resist blurring (e.g. acid diffusion effects in CAR, i.e. chemically amplified resists) and resist contrast as input numbers. Eventually, very important corrections such as blur-related CD errors or corner rounding are made by data modifications, assuming certain VSB writing parameters (or more generally, writing parameters of the reference tool in question). If the MBW has a different writing behavior, which can be in the simplest case just a smaller blur, the intended pattern will not be obtained directly by the data prepared for the VSB tool (reference tool). In general case not only the blur, but also the point spreading function (2D profile of the dose distribution function) deviates significantly due to the differences in the charged-particle optical systems.

For practical application, this means that tool users who also want to use VSB tools or other reference tools to produce masks for the same product cannot benefit from the enhanced productivity of the MBW machine unless the latter tool is able to match the VSB specific errors, or in other words, is provided with an online correction to minimize the difference in the lithographic result so as to emulate the VSM writing behavior. With this additional feature the MBW can be used for the same data that is also used for VSB writing, which increases the usability of a MBW very much as long as VSB tools are still in use.

Determination of the MRMC Kernel

It is quite usual that the intensity profile of the reference tool, for instance the intensity profile 61, 62 of a VSB writer, is known; for instance it has been determined experimentally. Alternatively, linearity plots (FIG. 19) may be known for the reference tool, from which the intensity profile can be calculated, or an experimental set of data, for example, a set of line widths as function of varying dose or varying design width, printed by the reference tool may be taken as initial data to determine the intensity profile. For determination/optimization of the MRMC kernel, it is here assumed that the intensity profiles are known (mathematically, the point spreading function, which is the dose distribution that an indefinitely small pattern element, like for example a delta function, generates on the substrate during the exposure, including blurring and other imaging artifacts).

The determination and optimization of the MRMC is typically an iterative process, where a certain number of points representing the MRMC kernel is varied systematically and/or stochastically so as to be optimized with respect to a target function (figure of merit). The target function can, for example, be the integral of the difference in linearity function (cf. FIG. 19A) or, in case of optimizing directional line width variation as discussed with reference to FIGS. 24A and 24B, the difference between the line widths for the line directions of interest.

Generally, such an optimization can be done with conventional algorithms using mathematical principles well-known in the state of the art. One standard methodology that can be used is a gradient method, or a linear regress method. As starting function, for example, the intensity profile of the reference tool, shown as an example in FIG. 26D in form of a single Gaussian function, is used. In fact, in many cases the intensity profile already presents a suitably good approximation for the final kernel, and further optimization is only needed in order to comply with higher demands in accuracy of the matching. The larger the difference of the blurs, the better the matching works and the more the kernel function will be dominated by the intensity distribution given by the larger blur.

Figure 26A:
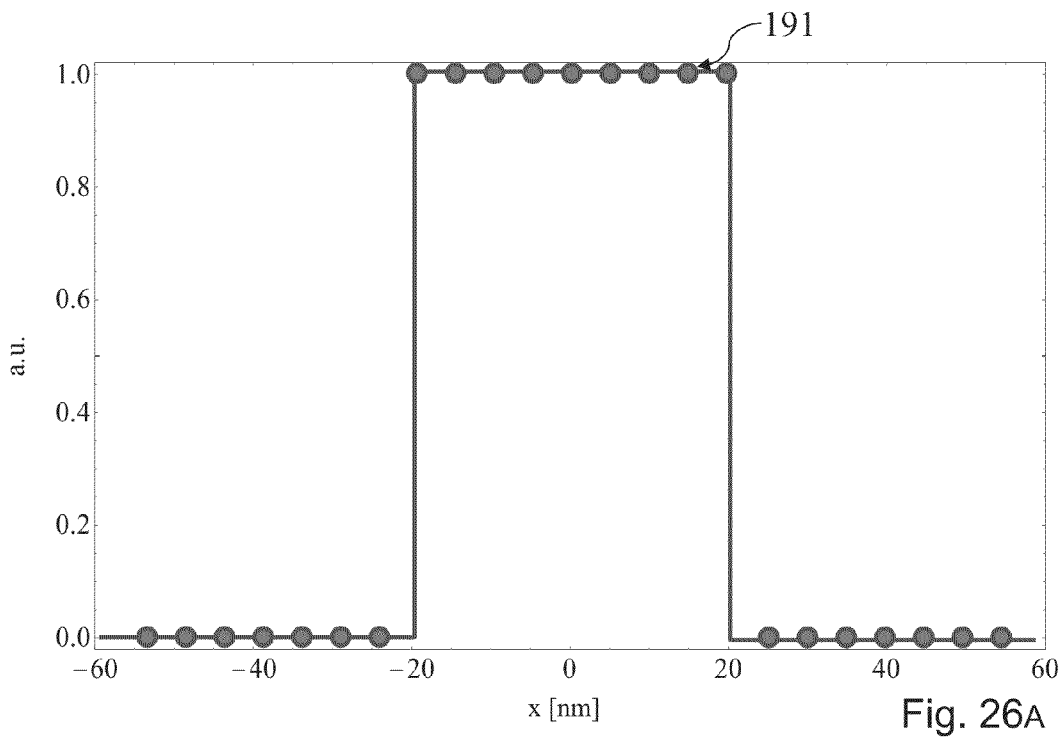
FIGS. 26A-D show examples of simple kernels each of which is suitable as a kernel according to certain embodiments of the invention, or as a starting point for calculating a kernel.
Figure 26B:
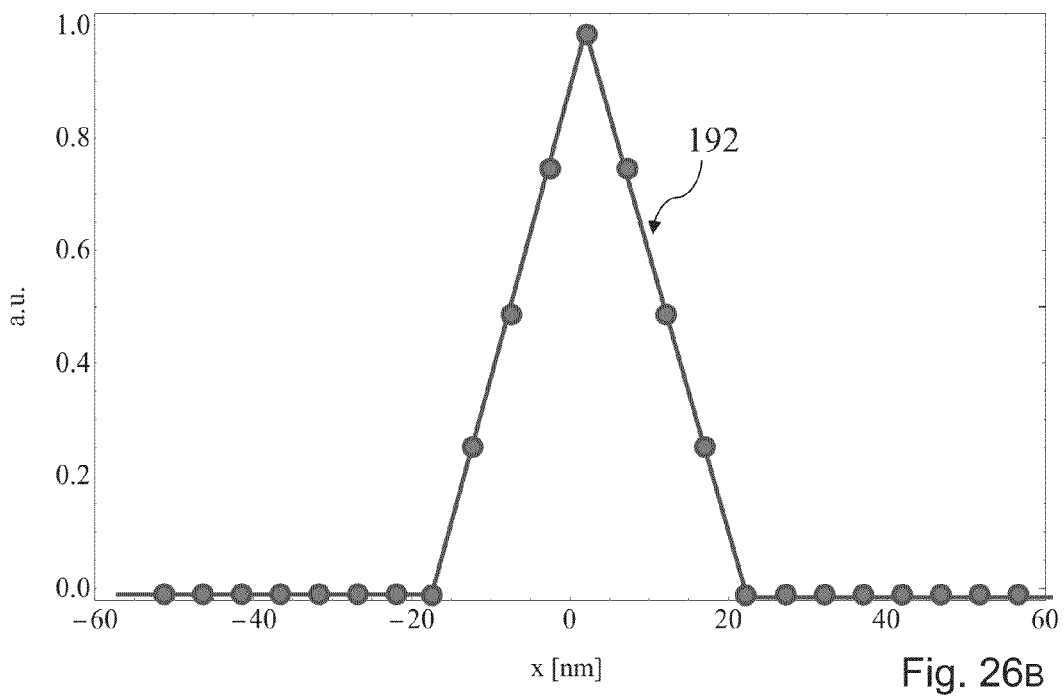
Figure 26C:
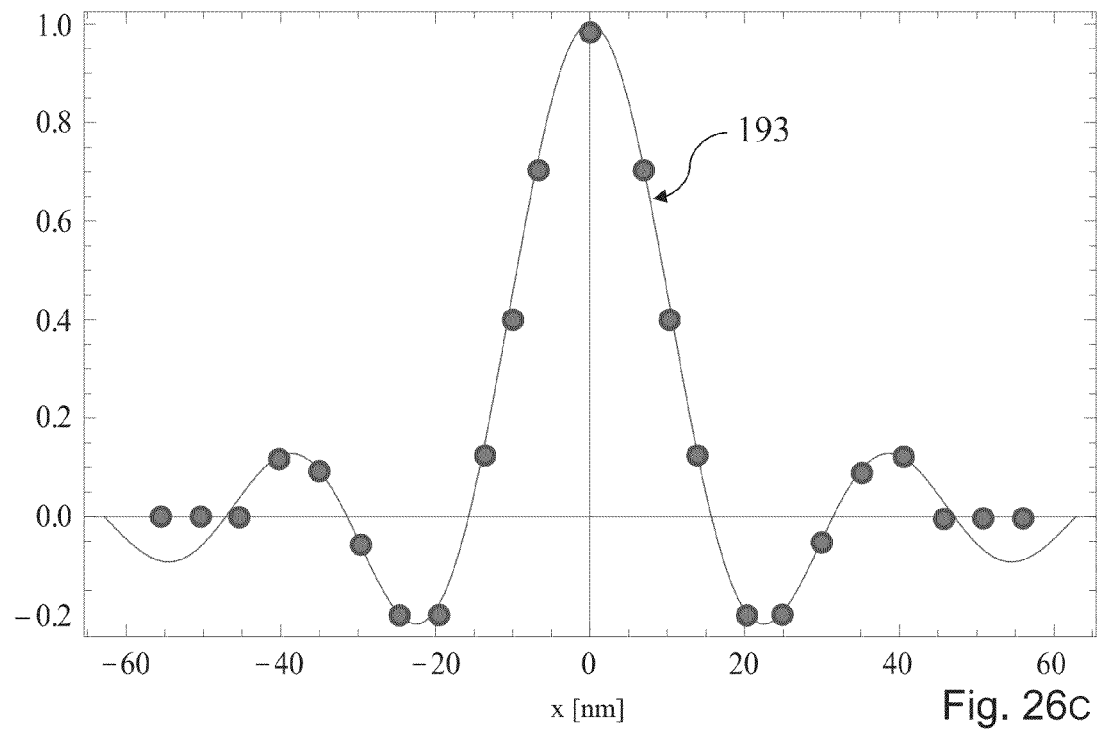
Figure 26D:
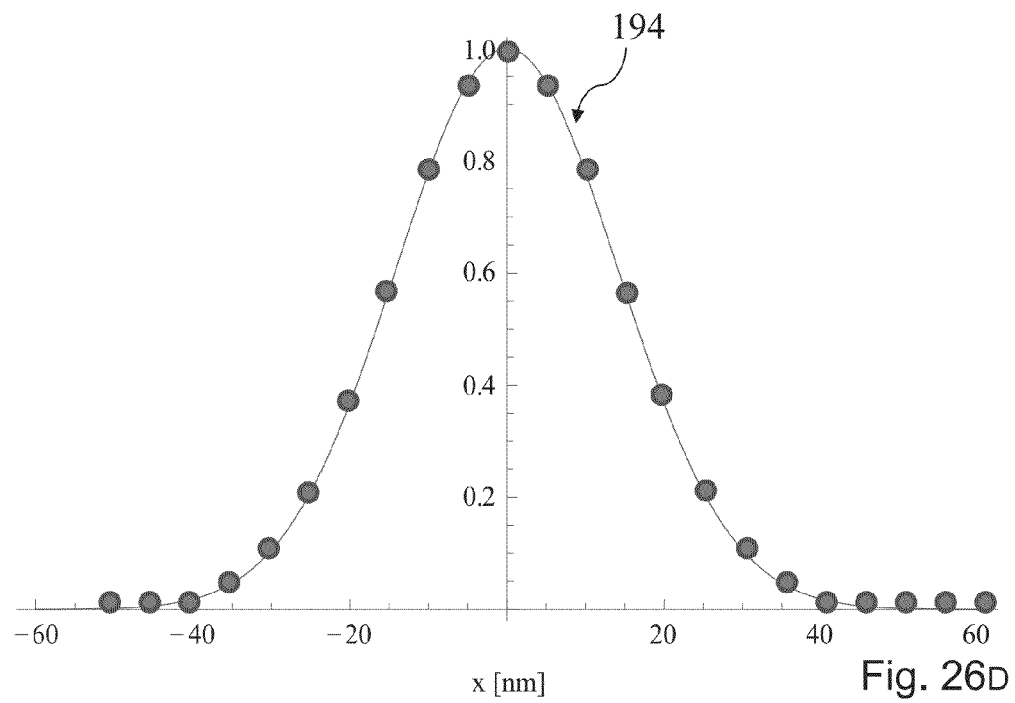

FIGS. 26A-D show examples of kernel functions that are suitable as starting functions for the linear regress calculation to find the optimum kernel. Alternatively, they may be sufficient for a number of tasks directly (without subsequent optimization). In particular, a rectangle function as depicted in FIG. 26A can also be used to achieve certain purposes as for example "moving averaging", the triangle function of FIG. 26B is suitable for performing a weighted averaging, or a sinc function as depicted in FIG. 26C may be used to obtain an "edge enhancement" or "patterns selective" filtering, where the kernel has the effect of a differentiation; finally, FIG. 26D illustrates a Gaussian shape. Please note that the negative values of the sinc-shaped kernel may result in nominal negative doses, to be replaced by a non-negative cut-off value such as zero, in order to avoid negative dose values on the substrate.

Of course, the MBW will itself have a blur (due to width of a spot and the point spread function). The MBW blur is usually very small as compared to the line width to be written on the target (by a factor of at least 1.5, typically 3 or even more), and even more so as compared the blur of the reference tool; therefore the MBW blur can be neglected for determining the kernel without significant detriment at least at the first stage. In the iterative approach, this is a safe procedure since the iteration will implicitly take into account effects of the MBW blur. In fact, it was found that usually the deviations introduced by neglecting the MBW blur in the kernel are marginal only already at the first stage.

The invention claimed is:

1. Method for computing an exposure pattern for exposing a desired pattern on a target in a charged-particle multi-beam processing apparatus, in which a particle beam is directed to and illuminates a pattern definition device comprising an aperture array composed of a plurality of blanking apertures through which said particle beam penetrates for writing said desired pattern by exposing a multitude of pixels within an image area on the target, wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale,
wherein during a writing process of said desired pattern, a sequence of exposure intervals is made, wherein in each exposure interval the blanking apertures are imaged onto the target, thus generating a corresponding plurality of aperture images,
wherein the method comprises:
i) providing the desired pattern as a graphical representation on the image area on the target, said graphical representation having a predetermined width of resolution, said width being larger than a nominal distance between neighboring positions of the pixels within said image area,
ii) providing a convolution kernel, said kernel describing a mapping from an element of the graphical representation to a group of pixels, said group of pixels being centered around a nominal position of said element,
iii) calculating a nominal exposure pattern as a pixel raster graphics defined on the multitude of pixels, by convolution of the graphical representation with the convolution kernel, said nominal exposure pattern being suitable to create a nominal dose distribution on the target.

2. The method according to claim 1, wherein the writing process generates aperture images which are mutually overlapping, and the aperture images have a nominal width which is a multiple of the distance between pixel positions of neighboring aperture images generated on the target, the method having the additional step:
iv) generating, from the nominal exposure pattern, an exposure pattern suitable to expose the desired pattern by said writing process through exposure of aperture images.

3. The method according to claim 1, wherein in step i, the graphical representation is a raster graphics on a reference raster having a raster width, said raster width being used as width of resolution.

4. The method according to claim 1, wherein in step i, the graphical representation is a vector graphics which is converted to a raster graphics on a reference raster having a raster width which is larger than a nominal distance between neighboring positions of the pixels within said image area.

5. The method according to claim 1, wherein the calculations of step iii, and subsequent calculations if present, are performed during a writing process in real time, performing associated calculations transiently without permanent storing of the data calculated.

6. The method according to claim 1, wherein the convolution kernel represents a point spreading function of a reference writing apparatus to be emulated by means of said processing apparatus.

7. The method according to claim 1, wherein the convolution kernel is represented as a discrete matrix of pixel values, and the convolution in step iii is performed as discrete convolution.

8. The method according to claim 1, wherein the convolution kernel includes time-dependent values, having a time dependency corresponding to a time-dependent writing behavior of a reference writing apparatus to be emulated.

9. The method according to claim 1, wherein the convolution kernel is anisotropic with regard to two main directions on the image area.

10. The method according to claim 9, wherein the anisotropic kernel is configured to compensate an anisotropy of imaging the blanking apertures onto the target.

11. The method according to claim 1, wherein the convolution in step iii is performed using arithmetic values which have an arithmetic precision higher than the resolution of the discrete gray scale.

12. The method according to claim 1, wherein two or more convolution kernels are used, each kernel being used on a respective sub-area among a plurality of sub-areas within the image area and/or with a respective aperture array from a plurality of aperture array present in the pattern definition device.

13. The method according to claim 1, wherein during the writing process the position of aperture images is kept fixed relative to the target at the position of a pixel during an exposure interval, but between exposure intervals the position of aperture images is shifted over the target, thus exposing the multitude of pixels within said image area on the target.

14. The method according to claim 1, wherein the width of resolution of the graphical representation is larger than a nominal width of the aperture images generated by the charged-particle multi-beam processing apparatus.

15. Charged-particle multi-beam processing apparatus for exposure of a target by means of a structured beam of electrically charged particles, comprising:

an illumination system,
a pattern definition device and
a projection optics system,
the illumination system being configured to produce a beam of said electrically charged particles and form it into a wide beam illuminating the pattern definition device, the pattern definition device being configured to form the shape of the illuminating beam into a structured beam composed of a multitude of sub-beams, and the projection optics system being configured to project an image of the beam shape defined in the pattern definition device onto the target, thus exposing a multitude of pixels within an image area on the target,
wherein the pattern definition device comprises an aperture array composed of a plurality of blanking apertures forming said sub-beams, said plurality of blanking apertures being arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, said dose value taking a respective value selected from a discrete gray scale,
configured such that during a writing process of a desired pattern, a sequence of exposure intervals is made, wherein in each exposure interval the blanking apertures are imaged onto the target, thus generating a corresponding plurality of aperture images,
said processing apparatus being configured for emulating a writing process for a desired pattern in a reference writing apparatus, said reference writing apparatus having a point spreading function having a width of resolution larger than a nominal width of the aperture images generated by the processing apparatus, said processing apparatus configured to implement a method comprising:
i) providing the desired pattern as a graphical representation on the image area on the target, said graphical representation having a predetermined width of resolution, said width being larger than a nominal distance between neighboring positions of the pixels within said image area,
ii) providing a convolution kernel, said kernel describing a mapping from an element of the graphical representation to a group of pixels, said group of pixels being centered around a nominal position of said element,
iii) calculating a nominal exposure pattern as a pixel raster graphics defined on the multitude of pixels, by convolution of the graphical representation with the convolution kernel, said nominal exposure pattern being suitable to create a nominal dose distribution on the target;
the method operating to convert the desired pattern into a nominal exposure pattern writable with the processing apparatus.

16. The method according to claim 1, wherein in step i, the graphical representation is a vector graphics which is converted to a raster graphics on a reference raster having a raster width.

* * * * *